(12) United States Patent
Drogi et al.

(10) Patent No.: US 11,444,576 B2
(45) Date of Patent: Sep. 13, 2022

(54) POWER AMPLIFIER BIAS MODULATION FOR MULTI-LEVEL SUPPLY ENVELOPE TRACKING

(71) Applicant: Skyworks Solutions, Inc., Irvine, CA (US)

(72) Inventors: Serge Francois Drogi, Flagstaff, AZ (US); Philip John Lehtola, Cedar Rapids, IA (US); Florinel G. Balteanu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/948,548

(22) Filed: Sep. 23, 2020

(65) Prior Publication Data

US 2021/0099133 A1    Apr. 1, 2021

Related U.S. Application Data

(60) Provisional application No. 62/907,008, filed on Sep. 27, 2019.

(51) Int. Cl.
*H04B 1/40* (2015.01)
*H03F 1/02* (2006.01)
(Continued)

(52) U.S. Cl.
CPC ......... *H03F 1/0216* (2013.01); *H03F 1/0227* (2013.01); *H03F 3/195* (2013.01);
(Continued)

(58) Field of Classification Search
CPC ............... H03F 2200/451; H03F 3/245; H03F 2200/105; H03F 1/0216; H04B 1/04;
(Continued)

(56) References Cited

U.S. PATENT DOCUMENTS

| 5,455,542 A | 10/1995 | Spence et al. |
| 5,459,762 A | 10/1995 | Wang et al. |

(Continued)

FOREIGN PATENT DOCUMENTS

| WO | WO 2018/052539 | 3/2018 |
| WO | WO 2021/061851 | 4/2021 |

OTHER PUBLICATIONS

Balteanu, Florinel "RF Front End Module Architectures for 5G," dated Nov. 2019, in 8 pages.
(Continued)

*Primary Examiner* — Emmanuel Bayard
(74) *Attorney, Agent, or Firm* — Knobbe, Martens, Olson & Bear, LLP

(57) ABSTRACT

Apparatus and methods for power amplifier bias modulation for multi-level supply envelope tracking are provided herein. In certain embodiments, an envelope tracking system includes a power amplifier that amplifies a radio frequency signal, a multi-level supply envelope tracker that generates a power amplifier supply voltage of the power amplifier based on an envelope signal indicating an envelope of the radio frequency signal, and a bias modulation circuit that modulates a bias of the power amplifier based on a voltage level of the power amplifier supply voltage.

20 Claims, 18 Drawing Sheets

(51) Int. Cl.
*H03F 3/24* (2006.01)
*H04B 1/16* (2006.01)
*H04B 1/04* (2006.01)
*H03F 3/195* (2006.01)

(52) U.S. Cl.
CPC .......... *H03F 3/245* (2013.01); *H04B 1/0475* (2013.01); *H04B 1/16* (2013.01); *H04B 1/40* (2013.01); *H03F 2200/102* (2013.01); *H03F 2200/105* (2013.01); *H03F 2200/165* (2013.01); *H03F 2200/168* (2013.01); *H03F 2200/336* (2013.01); *H03F 2200/451* (2013.01); *H04B 2001/0408* (2013.01)

(58) Field of Classification Search
CPC ............ H04B 2001/0408; H04B 17/13; H04B 1/0475; H04B 1/16; H04B 1/40
USPC .................. 375/219–222, 257, 295–297
See application file for complete search history.

(56) References Cited

U.S. PATENT DOCUMENTS

| | | | |
|---|---|---|---|
| 5,724,657 A | 3/1998 | Lin et al. |
| 5,761,250 A | 6/1998 | Lin |
| 6,204,734 B1 | 3/2001 | Zhang et al. |
| 6,438,365 B1 | 8/2002 | Balteanu |
| 6,639,470 B1 | 10/2003 | Andrys et al. |
| 6,671,500 B2 | 12/2003 | Damgaard et al. |
| 6,704,560 B1 | 3/2004 | Balteanu et al. |
| 6,734,729 B1 | 5/2004 | Andrys et al. |
| 6,768,382 B1 | 7/2004 | Shie et al. |
| 6,842,067 B2 | 1/2005 | Andrys et al. |
| 6,977,976 B1 | 12/2005 | Birkett et al. |
| 7,136,003 B1 | 11/2006 | Ripley et al. |
| 7,142,053 B2 | 11/2006 | Phillips et al. |
| 7,193,474 B2 | 3/2007 | Phillips et al. |
| 7,276,973 B2 | 10/2007 | Ripley et al. |
| 7,288,991 B2 | 10/2007 | Ripley |
| 7,385,442 B1 | 6/2008 | Ripley |
| 7,397,089 B2 | 7/2008 | Zhang et al. |
| 7,408,413 B2 | 8/2008 | Ripley |
| 7,414,479 B2 | 8/2008 | Ripley et al. |
| 7,443,246 B2 | 10/2008 | Andrys et al. |
| 7,482,868 B2 | 1/2009 | Hageman et al. |
| 7,496,339 B2 | 2/2009 | Balteanu et al. |
| 7,538,606 B2 | 5/2009 | Ripley |
| 7,589,592 B2 | 9/2009 | Fisher et al. |
| 7,605,651 B2 | 10/2009 | Ripley et al. |
| 7,696,826 B2 | 4/2010 | Ripley et al. |
| 7,876,160 B2 | 1/2011 | Zhang et al. |
| 7,994,861 B2 | 8/2011 | Fisher et al. |
| 8,023,909 B2 | 9/2011 | Ripley et al. |
| 8,049,565 B2 | 11/2011 | Zhang et al. |
| 8,140,028 B2 | 3/2012 | Balteanu et al. |
| 8,154,345 B2 | 4/2012 | Andrys et al. |
| 8,188,793 B2 | 5/2012 | Ripley et al. |
| 8,330,546 B2 | 12/2012 | Ripley et al. |
| 8,351,873 B2 | 1/2013 | Balteanu et al. |
| 8,362,840 B2 | 1/2013 | Andrys et al. |
| 8,421,539 B2 | 4/2013 | Zhang et al. |
| 8,514,016 B2 | 8/2013 | Ripley et al. |
| 8,526,995 B2 | 9/2013 | Ripley et al. |
| 8,537,579 B2 | 9/2013 | Ripley et al. |
| 8,598,953 B2 | 12/2013 | Fisher et al. |
| 8,611,836 B2 | 12/2013 | Ripley et al. |
| 8,634,789 B2 | 1/2014 | Chang et al. |
| 8,644,777 B2 | 2/2014 | Ripley et al. |
| 8,666,337 B2 | 3/2014 | Ripley et al. |
| 8,717,100 B2 | 5/2014 | Reisner et al. |
| 8,718,188 B2 | 5/2014 | Balteanu et al. |
| 8,719,459 B2 | 5/2014 | Ripley |
| 8,774,739 B2 | 7/2014 | Ripley et al. |
| 8,786,371 B2 | 7/2014 | Popplewell et al. |
| 8,791,719 B2 | 7/2014 | Ripley |
| 8,824,991 B2 | 9/2014 | Chang et al. |
| 8,928,426 B2 | 1/2015 | Li et al. |
| 8,928,427 B2 | 1/2015 | Li et al. |
| 8,941,449 B2 | 1/2015 | Li et al. |
| 8,948,712 B2 | 2/2015 | Chen et al. |
| 8,981,847 B2 | 3/2015 | Balteanu |
| 8,983,406 B2 | 3/2015 | Zhang et al. |
| 8,989,682 B2 | 3/2015 | Ripley et al. |
| 9,030,259 B2 | 5/2015 | Fisher et al. |
| 9,041,472 B2 | 5/2015 | Chen et al. |
| 9,042,854 B2 | 5/2015 | Wang et al. |
| 9,054,575 B2 | 6/2015 | Ripley et al. |
| 9,054,663 B2 | 6/2015 | Reisner et al. |
| 9,071,335 B2 | 6/2015 | Agarwal et al. |
| 9,083,282 B2 | 7/2015 | Zhang et al. |
| 9,083,455 B2 | 7/2015 | Popplewell et al. |
| 9,092,393 B2 | 7/2015 | Whitefield et al. |
| 9,106,183 B2 | 8/2015 | Liu et al. |
| 9,116,183 B2 | 8/2015 | Cummins et al. |
| 9,118,277 B2 | 8/2015 | Balteanu et al. |
| 9,136,795 B2 | 9/2015 | Liu et al. |
| 9,143,096 B2 | 9/2015 | Balteanu et al. |
| 9,189,430 B2 | 11/2015 | Ross et al. |
| 9,197,128 B2 | 11/2015 | Popplewell et al. |
| 9,202,747 B2 | 12/2015 | Chen et al. |
| 9,203,529 B2 | 12/2015 | Chen et al. |
| 9,214,387 B2 | 12/2015 | Chen et al. |
| 9,214,979 B2 | 12/2015 | Ripley |
| 9,225,298 B2 | 12/2015 | Ripley et al. |
| 9,231,528 B2 | 1/2016 | Granger-Jones et al. |
| 9,231,533 B2 | 1/2016 | Zhang et al. |
| 9,288,098 B2 | 3/2016 | Yan et al. |
| 9,294,043 B2 | 3/2016 | Ripley et al. |
| 9,294,054 B2 | 3/2016 | Balteanu et al. |
| 9,295,157 B2 | 3/2016 | Chen et al. |
| 9,305,859 B2 | 4/2016 | Williams et al. |
| 9,374,045 B2 | 6/2016 | Zhang et al. |
| 9,391,648 B2 | 7/2016 | Popplewell et al. |
| 9,418,950 B2 | 8/2016 | Zhang et al. |
| 9,419,567 B2 | 8/2016 | Ripley et al. |
| 9,425,833 B2 | 8/2016 | Popplewell et al. |
| 9,445,371 B2 | 9/2016 | Khesbak et al. |
| 9,450,639 B2 | 9/2016 | Zhang et al. |
| 9,451,566 B1 | 9/2016 | Morshedi et al. |
| 9,455,669 B2 | 9/2016 | Modi et al. |
| 9,467,940 B2 | 10/2016 | Zhang et al. |
| 9,473,019 B2 | 10/2016 | Ripley et al. |
| 9,473,073 B2 | 10/2016 | Liu et al. |
| 9,490,827 B2 | 11/2016 | Wang et al. |
| 9,503,025 B2 | 11/2016 | Cao et al. |
| 9,506,968 B2 | 11/2016 | Hoang et al. |
| 9,515,029 B2 | 12/2016 | Chen et al. |
| 9,520,835 B2 | 12/2016 | Ko et al. |
| 9,543,919 B2 | 1/2017 | Ripley |
| 9,571,049 B2 | 2/2017 | Zhang et al. |
| 9,571,152 B2 | 2/2017 | Ripley et al. |
| 9,584,070 B2 | 2/2017 | Balteanu et al. |
| 9,588,529 B2 | 3/2017 | Balteanu et al. |
| 9,602,060 B2 | 3/2017 | Gorbachov et al. |
| 9,602,064 B2 | 3/2017 | Wu et al. |
| 9,606,947 B2 | 3/2017 | Ross et al. |
| 9,621,034 B2 | 4/2017 | Liu et al. |
| 9,621,118 B2 | 4/2017 | Ripley et al. |
| 9,646,936 B2 | 5/2017 | Chen et al. |
| 9,660,584 B2 | 5/2017 | Modi et al. |
| 9,667,200 B2 | 5/2017 | Ripley |
| 9,668,215 B2 | 5/2017 | Balteanu et al. |
| 9,673,707 B2 | 6/2017 | Popplewell et al. |
| 9,678,528 B2 | 6/2017 | Ripley |
| 9,679,869 B2 | 6/2017 | Petty-weeks et al. |
| 9,692,357 B2 | 6/2017 | Hoang et al. |
| 9,698,736 B2 | 7/2017 | Ripley |
| 9,698,740 B2 | 7/2017 | Lin et al. |
| 9,698,832 B2 | 7/2017 | Popplewell et al. |
| 9,698,853 B2 | 7/2017 | Andrys et al. |
| 9,703,913 B2 | 7/2017 | Chen et al. |
| 9,712,125 B2 | 7/2017 | Lehtola et al. |
| 9,712,196 B2 | 7/2017 | Ripley et al. |
| 9,712,197 B2 | 7/2017 | Ripley et al. |

(56) References Cited

U.S. PATENT DOCUMENTS

| | | |
|---|---|---|
| 9,722,547 B2 | 8/2017 | Ripley et al. |
| 9,735,737 B2 | 8/2017 | Gorbachov et al. |
| 9,748,985 B2 | 8/2017 | Zhang et al. |
| 9,768,740 B2 | 9/2017 | Zhang et al. |
| 9,774,300 B2 | 9/2017 | Jin et al. |
| 9,780,741 B2 | 10/2017 | Ripley et al. |
| 9,806,395 B2 | 10/2017 | Li et al. |
| 9,806,676 B2 | 10/2017 | Balteanu et al. |
| 9,806,679 B2 | 10/2017 | Gorbachov et al. |
| 9,831,765 B2 | 11/2017 | Liu et al. |
| 9,831,834 B2 | 11/2017 | Balteanu et al. |
| 9,831,841 B2 | 11/2017 | Wu et al. |
| 9,837,965 B1 | 12/2017 | Wagh et al. |
| 9,838,058 B2 | 12/2017 | Pehlke et al. |
| 9,843,293 B1 | 12/2017 | Wagh et al. |
| 9,847,755 B2 | 12/2017 | Sun et al. |
| 9,853,620 B2 | 12/2017 | Gorbachov et al. |
| 9,871,599 B2 | 1/2018 | Chen et al. |
| 9,876,471 B2 | 1/2018 | Modi et al. |
| 9,876,473 B2 | 1/2018 | Khesbak et al. |
| 9,887,668 B2 | 2/2018 | Zampardi, Jr. et al. |
| 9,893,682 B2 | 2/2018 | Zhu et al. |
| 9,893,686 B2 | 2/2018 | Ripley |
| 9,899,961 B2 | 2/2018 | Lehtola et al. |
| 9,905,902 B2 | 2/2018 | Zhang et al. |
| 9,912,233 B2 | 3/2018 | Liu et al. |
| 9,929,694 B2 | 3/2018 | Ripley |
| 9,935,582 B2 | 4/2018 | Balteanu et al. |
| 9,935,677 B2 | 4/2018 | Puente et al. |
| 9,948,241 B2 | 4/2018 | Popplewell et al. |
| 9,966,982 B2 | 5/2018 | Ripley et al. |
| 9,971,377 B2 | 5/2018 | Balteanu et al. |
| 9,973,088 B2 | 5/2018 | Balteanu et al. |
| 9,985,592 B2 | 5/2018 | Gorbachov et al. |
| 9,990,322 B2 | 6/2018 | Whitefield et al. |
| 9,991,856 B2 | 6/2018 | Khesbak et al. |
| 10,033,277 B2 | 7/2018 | Ripley et al. |
| 10,033,385 B2 | 7/2018 | Ripley |
| 10,038,406 B2 | 7/2018 | Liu et al. |
| 10,041,987 B2 | 8/2018 | Hoang et al. |
| 10,044,400 B2 | 8/2018 | Zhang et al. |
| 10,050,529 B2 | 8/2018 | Pehlke et al. |
| 10,061,885 B2 | 8/2018 | Chen et al. |
| 10,063,200 B2 | 8/2018 | Wu et al. |
| 10,080,192 B2 | 9/2018 | Balteanu et al. |
| 10,090,811 B2 | 10/2018 | Ripley et al. |
| 10,090,812 B2 | 10/2018 | Modi et al. |
| 10,097,216 B2 | 10/2018 | Gorbachov et al. |
| 10,103,726 B2 | 10/2018 | Wilz et al. |
| 10,116,274 B2 | 10/2018 | Ripley et al. |
| 10,135,408 B2 | 11/2018 | Cao et al. |
| 10,141,901 B2 | 11/2018 | Zhang et al. |
| 10,147,994 B2 | 12/2018 | Jayaraman et al. |
| 10,181,820 B2 | 1/2019 | Balteanu et al. |
| 11,082,021 B2 | 8/2021 | Lin et al. |
| 11,239,800 B2 | 2/2022 | Drogi et al. |
| 2007/0268074 A1* | 11/2007 | Vejzovic ............. H03F 1/301 330/296 |
| 2008/0051042 A1 | 2/2008 | Komaili et al. |
| 2008/0101263 A1 | 5/2008 | Barber et al. |
| 2009/0040671 A1 | 2/2009 | Zhang |
| 2009/0206932 A1* | 8/2009 | Wu ................. H03F 3/195 330/284 |
| 2010/0197365 A1 | 8/2010 | Ripley et al. |
| 2011/0025422 A1 | 2/2011 | Marra et al. |
| 2011/0043284 A1 | 2/2011 | Zhao et al. |
| 2011/0128761 A1 | 6/2011 | Ripley et al. |
| 2012/0019335 A1 | 1/2012 | Hoang et al. |
| 2012/0119840 A1 | 5/2012 | Sanduleanu et al. |
| 2012/0154036 A1 | 6/2012 | Oh et al. |
| 2012/0200354 A1* | 8/2012 | Ripley ............... H03F 3/193 330/131 |
| 2012/0269240 A1* | 10/2012 | Balteanu ............ H03F 1/0211 375/219 |
| 2013/0285750 A1* | 10/2013 | Chowdhury ........ H03F 1/0222 330/296 |
| 2013/0310114 A1 | 11/2013 | Zohny et al. |
| 2014/0184334 A1 | 7/2014 | Nobbe et al. |
| 2014/0266448 A1 | 9/2014 | Cha et al. |
| 2014/0327483 A1 | 11/2014 | Balteanu |
| 2015/0061770 A1 | 3/2015 | Luo et al. |
| 2015/0145596 A1 | 5/2015 | Fagg |
| 2015/0145604 A1* | 5/2015 | Scott ................. H03F 3/24 330/296 |
| 2015/0171796 A1* | 6/2015 | Matsui ............... H03F 3/19 330/296 |
| 2015/0236651 A1 | 8/2015 | Yang et al. |
| 2015/0236652 A1* | 8/2015 | Yang ................. H03F 1/0227 330/251 |
| 2015/0270806 A1* | 9/2015 | Wagh ................ H03F 1/3247 330/296 |
| 2015/0280655 A1 | 10/2015 | Nobbe et al. |
| 2015/0365052 A1* | 12/2015 | Barton ............... H03F 3/19 330/295 |
| 2016/0014935 A1 | 1/2016 | Agarwal et al. |
| 2016/0027571 A1 | 1/2016 | Zhang et al. |
| 2016/0094254 A1 | 3/2016 | Ripley |
| 2016/0163661 A1 | 6/2016 | Chen et al. |
| 2016/0241210 A1 | 8/2016 | Andrys et al. |
| 2016/0241292 A1 | 8/2016 | Ripley |
| 2016/0241299 A1 | 8/2016 | Ripley |
| 2016/0242057 A1 | 8/2016 | Ripley et al. |
| 2016/0248381 A1* | 8/2016 | Yang ................. H03F 1/0227 |
| 2016/0294328 A1* | 10/2016 | Kondo ............... H03F 3/211 |
| 2016/0329866 A1 | 11/2016 | Gorbachov et al. |
| 2017/0005629 A1* | 1/2017 | Yang ................. H03F 1/0238 |
| 2017/0040955 A1* | 2/2017 | Yang ................. H03F 3/245 |
| 2017/0085223 A1 | 3/2017 | Miol et al. |
| 2017/0093505 A1 | 3/2017 | Ripley et al. |
| 2017/0094607 A1 | 3/2017 | Ripley |
| 2017/0099059 A1 | 4/2017 | Wang et al. |
| 2017/0126185 A1* | 5/2017 | Kang ................. H03F 3/45179 |
| 2017/0131734 A1 | 5/2017 | Balteanu et al. |
| 2017/0149437 A1 | 5/2017 | Luo et al. |
| 2017/0160318 A1 | 6/2017 | Zhang et al. |
| 2017/0162705 A1 | 6/2017 | Gorbachov et al. |
| 2017/0163218 A1 | 6/2017 | Gorbachov et al. |
| 2017/0163226 A1 | 6/2017 | Gorbachov et al. |
| 2017/0195972 A1 | 7/2017 | Drogi et al. |
| 2017/0223632 A1 | 8/2017 | Balteanu et al. |
| 2017/0228332 A1 | 8/2017 | Ross et al. |
| 2017/0264253 A1 | 9/2017 | Gorbachov et al. |
| 2017/0271301 A1 | 9/2017 | Petty-weeks et al. |
| 2017/0271302 A1 | 9/2017 | Petty-weeks et al. |
| 2017/0271303 A1 | 9/2017 | Petty-weeks et al. |
| 2017/0277216 A1 | 9/2017 | Ripley |
| 2017/0279350 A1 | 9/2017 | Liu et al. |
| 2017/0294885 A1* | 10/2017 | Kang ................. H04B 1/04 |
| 2017/0301647 A1 | 10/2017 | Petty-weeks et al. |
| 2017/0302231 A1 | 10/2017 | Ripley et al. |
| 2017/0317648 A1 | 11/2017 | Gorbachov et al. |
| 2017/0317653 A1 | 11/2017 | Lehtola et al. |
| 2017/0324432 A1 | 11/2017 | Zhang et al. |
| 2017/0338773 A1 | 11/2017 | Balteanu et al. |
| 2017/0346516 A1 | 11/2017 | Ripley et al. |
| 2018/0076772 A1 | 3/2018 | Khesbak et al. |
| 2018/0083578 A1 | 3/2018 | Klaren et al. |
| 2018/0097482 A1 | 4/2018 | Gorbachov et al. |
| 2018/0102753 A1 | 4/2018 | Gorbachov et al. |
| 2018/0123528 A1 | 5/2018 | Jo et al. |
| 2018/0123529 A1 | 5/2018 | Jo et al. |
| 2018/0138574 A1 | 5/2018 | Li et al. |
| 2018/0138862 A1 | 5/2018 | Balteanu et al. |
| 2018/0152945 A1 | 5/2018 | Balteanu |
| 2018/0159476 A1 | 6/2018 | Balteanu et al. |
| 2018/0159478 A1 | 6/2018 | Balteanu et al. |
| 2018/0159577 A1 | 6/2018 | Pehlke et al. |
| 2018/0167037 A1 | 6/2018 | Zhu et al. |
| 2018/0175814 A1 | 6/2018 | Wu et al. |
| 2018/0183389 A1 | 6/2018 | Lehtola et al. |
| 2018/0191050 A1 | 7/2018 | Zhang et al. |
| 2018/0234095 A1 | 8/2018 | Balteanu et al. |
| 2018/0262170 A1 | 9/2018 | Gorbachov et al. |

(56) References Cited

U.S. PATENT DOCUMENTS

| | | |
|---|---|---|
| 2018/0269838 A1 | 9/2018 | Ripley |
| 2018/0278214 A1 | 9/2018 | Jin et al. |
| 2018/0287573 A1 | 10/2018 | Khesbak et al. |
| 2018/0294776 A1 | 10/2018 | Popplewell et al. |
| 2018/0302036 A1 | 10/2018 | Balteanu et al. |
| 2018/0331659 A1 | 11/2018 | Khesbak et al. |
| 2018/0343029 A1 | 11/2018 | Zhang et al. |
| 2018/0351454 A1 | 12/2018 | Khesbak et al. |
| 2018/0351457 A1 | 12/2018 | Ripley |
| 2018/0365365 A1 | 12/2018 | Chen et al. |
| 2018/0375476 A1 | 12/2018 | Balteanu et al. |
| 2018/0375483 A1 | 12/2018 | Balteanu et al. |
| 2019/0020315 A1 | 1/2019 | Khesbak et al. |
| 2019/0028136 A1 | 1/2019 | Zhang et al. |
| 2019/0036524 A1 | 1/2019 | Wilz et al. |
| 2019/0041442 A1 | 2/2019 | Hoang et al. |
| 2019/0044554 A1 | 2/2019 | Gorbachov et al. |
| 2019/0074813 A1 | 3/2019 | Zou et al. |
| 2019/0123690 A1 | 4/2019 | Balteanu et al. |
| 2019/0131684 A1 | 5/2019 | Jayaraman et al. |
| 2019/0158045 A1 | 5/2019 | Zampardi, Jr. et al. |
| 2019/0158046 A1 | 5/2019 | Lehtola et al. |
| 2019/0165736 A1 | 5/2019 | Khesbak et al. |
| 2019/0171785 A1 | 6/2019 | Chen et al. |
| 2019/0173432 A1* | 6/2019 | Van Der Heijden ..... H03F 3/19 |
| 2019/0181816 A1* | 6/2019 | Ishihara ................... H03F 3/21 |
| 2019/0190462 A1 | 6/2019 | Zhu et al. |
| 2019/0199434 A1 | 6/2019 | Ripley |
| 2019/0214902 A1 | 7/2019 | Liu et al. |
| 2019/0215774 A1 | 7/2019 | Ripley |
| 2019/0229621 A1 | 7/2019 | Balteanu et al. |
| 2019/0229679 A1 | 7/2019 | Gorbachov et al. |
| 2019/0229682 A1 | 7/2019 | Gorbachov et al. |
| 2019/0245439 A1 | 8/2019 | Pehlke et al. |
| 2019/0273473 A1 | 9/2019 | Gorbachov et al. |
| 2019/0273478 A1 | 9/2019 | Lin et al. |
| 2019/0273480 A1 | 9/2019 | Lin et al. |
| 2019/0288671 A1 | 9/2019 | Ripley et al. |
| 2019/0312328 A1 | 10/2019 | Zhang et al. |
| 2019/0319583 A1 | 10/2019 | El-Hassan et al. |
| 2019/0319720 A1 | 10/2019 | Ripley et al. |
| 2019/0331716 A1 | 10/2019 | Zhang et al. |
| 2019/0334564 A1 | 10/2019 | Gorbachov et al. |
| 2019/0341888 A1 | 11/2019 | Drogi et al. |
| 2019/0372526 A1 | 12/2019 | Balteanu et al. |
| 2019/0372628 A1 | 12/2019 | Balteanu et al. |
| 2019/0379332 A1 | 12/2019 | Ripley |
| 2019/0385781 A1 | 12/2019 | Zhang et al. |
| 2019/0386617 A1 | 12/2019 | Naraine et al. |
| 2019/0386698 A1 | 12/2019 | Miol et al. |
| 2020/0007088 A1 | 1/2020 | Ranta et al. |
| 2020/0007177 A1 | 1/2020 | Ripley et al. |
| 2020/0052660 A1 | 2/2020 | Cao et al. |
| 2020/0067406 A1 | 2/2020 | Khesbak et al. |
| 2020/0076393 A1 | 3/2020 | Gorbachov et al. |
| 2020/0083915 A1 | 3/2020 | Zhang et al. |
| 2020/0091820 A1 | 3/2020 | Ripley |
| 2020/0091870 A1 | 3/2020 | Lehtola et al. |
| 2020/0091878 A1* | 3/2020 | Maxim ................ H03F 1/0227 |
| 2020/0099343 A1 | 3/2020 | Khesbak et al. |
| 2020/0103448 A1 | 4/2020 | Hoang et al. |
| 2020/0106399 A1 | 4/2020 | Ripley et al. |
| 2020/0112300 A1 | 4/2020 | Balteanu et al. |
| 2020/0127619 A1 | 4/2020 | Khesbak et al. |
| 2020/0136670 A1 | 4/2020 | Zhang et al. |
| 2020/0154434 A1 | 5/2020 | Balteanu |
| 2020/0159275 A1 | 5/2020 | Ripley |
| 2020/0162028 A1 | 5/2020 | Balteanu et al. |
| 2020/0162030 A1 | 5/2020 | Drogi et al. |
| 2020/0162032 A1 | 5/2020 | Ripley et al. |
| 2020/0162039 A1 | 5/2020 | Lehtola et al. |
| 2020/0195202 A1 | 6/2020 | Gorbachov et al. |
| 2020/0195207 A1 | 6/2020 | Ripley |
| 2020/0259458 A1 | 8/2020 | Balteanu et al. |
| 2020/0259459 A1 | 8/2020 | Balteanu et al. |
| 2020/0321923 A1 | 10/2020 | Park et al. |
| 2020/0335844 A1 | 10/2020 | Jayaraman et al. |
| 2020/0336110 A1 | 10/2020 | Drogi et al. |
| 2020/0336122 A1 | 10/2020 | Lin et al. |
| 2020/0343865 A1 | 10/2020 | Balteanu et al. |
| 2021/0028872 A1* | 1/2021 | Cho ..................... H04B 17/102 |
| 2021/0099136 A1 | 4/2021 | Drogi et al. |
| 2021/0119582 A1* | 4/2021 | Cappello ............... H03F 1/0227 |
| 2021/0384875 A1 | 12/2021 | Lyalin et al. |
| 2021/0384876 A1 | 12/2021 | Lyalin et al. |
| 2021/0384880 A1 | 12/2021 | Lin et al. |
| 2022/0109404 A1 | 4/2022 | Drogi et al. |

OTHER PUBLICATIONS

International Search Report and Written Opinion for International Application No. PCT/US2020/052315 dated Jan. 12, 2021 in 10 pages.

International Preliminary Report on Patentability and Written Opinion for International Application No. PCT/US2020/052315 dated Mar. 15, 2022, in 6 pages.

* cited by examiner

POWER AMPLIFIER BIAS MODULATION FOR MULTI-LEVEL SUPPLY ENVELOPE TRACKING

CROSS-REFERENCE TO RELATED APPLICATIONS

This application claims the benefit of priority under 35 U.S.C. § 119 of U.S. Provisional Patent Application No. 62/907,008, filed Sep. 27, 2019 and titled "POWER AMPLIFIER BIAS MODULATION FOR LOW BANDWIDTH ENVELOPE TRACKING," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in RF communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for fifth generation (5G) communications in frequency range 1 (FR1).

SUMMARY

In certain embodiments, the present disclosure relates to an envelope tracking system. The envelope tracking system includes a power amplifier configured to amplify a radio frequency signal, and an envelope tracker configured to generate a power amplifier supply voltage of the power amplifier based on an envelope signal indicating an envelope of the radio frequency signal. The envelope tracker has a modulation bandwidth less than a full bandwidth of the radio frequency signal. The envelope tracking system further includes a bias modulation circuit configured to modulate a bias of the power amplifier based on a voltage level of the power amplifier supply voltage.

In various embodiments, the modulation bandwidth of the envelope tracker is less than 100 megahertz. According to a number of embodiments, the modulation bandwidth of the envelope tracker is less than 20 megahertz.

In several embodiments, the envelope signal is shaped.

In some embodiments, the envelope tracking system further includes a digital pre-distortion system configured to generate a digital transmit signal, and a modulator configured to generate the radio frequency signal based on the digital transmit signal. According to a number of embodiments, the envelope tracking system further includes a power amplifier supply voltage digital filter model configured to generate a supply voltage modeling signal estimating the voltage level of the power amplifier supply voltage at the power amplifier, the digital pre-distortion system operable to digitally pre-distort the digital transmit signal based on the supply voltage modeling signal.

In various embodiments, the bias modulation circuit is configured to modulate a bias of at least one cascode transistor of the power amplifier.

In several embodiments, the envelope tracker is implemented as a multi-level supply envelope tracker. According to a number of embodiments, the multi-level supply envelope tracker includes a multi-level supply DC-to-DC converter configured to generate a plurality of regulated voltages of different voltage levels, a modulator configured to receive the plurality of regulated voltages and having an output configured to control the voltage level of the power amplifier supply voltage, and a control circuit configured to control the modulator based on the envelope signal. In accordance with various embodiments, the multi-level supply envelope tracker further includes a passive filter interposed between the output of the modulator and a supply input to the power amplifier. According to some embodiments, the bias modulation circuit receives the power amplifier supply voltage from the output of the modulator prior to filtering by the passive filter, and the power amplifier receives the power amplifier supply voltage after filtering by the passive filter. In accordance with a number of embodiments, the envelope tracking system further includes a separate supply voltage filter operable to filter the power amplifier supply voltage to generate a filtered power amplifier supply voltage that serves as an input to the bias modulation circuit. According to various embodiments, the separate supply voltage filter is programmable. In accordance with some embodiments, the modulator further includes a plurality of switches each electrically connected between a corresponding one of the plurality of regulated voltages and the output.

In various embodiments, the envelope tracking system further includes a programmable supply voltage filter operable to filter the power amplifier supply voltage to generate a filtered power amplifier supply voltage that serves as an input to the bias modulation circuit. According to a number of embodiments, the programmable supply voltage filter is implemented as a low pass filter having a controllable corner frequency.

In several embodiments, the power amplifier includes a first power amplifier stage and a second power amplifier stage arranged in a cascade. According to a number of embodiments, the bias modulation circuit is configured to generate a bias signal for the second power amplifier stage and the second power amplifier stage is powered by the power amplifier supply voltage. In accordance with various embodiments, a bias of the first power amplifier stage is substantially fixed. According to some embodiments, both the first power amplifier stage and the second power amplifier stage are powered by the power amplifier supply voltage. In accordance with a number of embodiments, the bias modulation circuit is configured to generate a first bias signal that biases the first power amplifier stage and a second bias signal that biases the second power amplifier stage. According to various embodiments, the bias modulation circuit is operable to increase the first bias signal and decrease the second bias signal in response to the envelope tracker decreasing the voltage level of the power amplifier supply voltage. In accordance with some embodiments, the first power amplifier stage includes a first bipolar transistor having a base biased by the first bias signal and a collector that receives the power amplifier supply voltage, and a second bipolar transistor having a base biased by the second bias signal and a collector that receives the power amplifier supply voltage. According to a number of embodiments, at least one of the first power amplifier stage or the second power amplifier stage includes a cascode transistor. In accordance with various embodiments, the envelope tracking system further includes a cascode bias circuit configured to modulate a bias the cascode transistor. According to some embodiments, the cascode bias transistor is configured to modulate the bias of the cascode transistor based on the envelope signal.

In a number of embodiments, the envelope tracking system is implemented on a packaged module.

In certain embodiments, the present disclosure relates to a mobile device. The mobile device includes a transceiver configured to generate a radio frequency signal, a front end circuit including a power amplifier configured to amplify the radio frequency signal, and a power management circuit including an envelope tracker configured to generate a power amplifier supply voltage of the power amplifier based on an envelope signal indicating an envelope of the radio frequency signal. The envelope tracker has a modulation bandwidth less than a full bandwidth of the radio frequency signal, and the power management circuit further includes a bias modulation circuit configured to modulate a bias of the power amplifier based on a voltage level of the power amplifier supply voltage.

In various embodiments, the modulation bandwidth of the envelope tracker is less than 100 megahertz. According to a number of embodiments, the modulation bandwidth of the envelope tracker is less than 20 megahertz.

In several embodiments, the envelope signal is shaped.

In some embodiments, the mobile device further includes a digital processing circuit including a digital pre-distortion system configured to generate a digital transmit signal, the transceiver including a modulator configured to generate the radio frequency signal based on the digital transmit signal. According to a number of embodiments, the digital processing circuit further includes a power amplifier supply voltage digital filter model configured to generate a supply voltage modeling signal estimating the voltage level of the power amplifier supply voltage at the power amplifier, the digital pre-distortion system operable to digitally pre-distort the digital transmit signal based on the supply voltage modeling signal.

In various embodiments, the bias modulation circuit is configured to modulate a bias of at least one cascode transistor of the power amplifier.

In several embodiments, the envelope tracker is implemented as a multi-level supply envelope tracker. According to a number of embodiments, the multi-level supply envelope tracker includes a multi-level supply DC-to-DC converter configured to generate a plurality of regulated voltages of different voltage levels, a modulator configured to receive the plurality of regulated voltages and having an output configured to control the voltage level of the power amplifier supply voltage, and a control circuit configured to control the modulator based on the envelope signal. In accordance with some embodiments, the multi-level supply envelope tracker further includes a passive filter interposed between the output of the modulator and a supply input to the power amplifier. According to various embodiments, the bias modulation circuit receives the power amplifier supply voltage from the output of the modulator prior to filtering by the passive filter, and the power amplifier receives the power amplifier supply voltage after filtering by the passive filter. In accordance with a number of embodiments, the power management circuit further includes a separate supply voltage filter operable to filter the power amplifier supply voltage to generate a filtered power amplifier supply voltage that serves as an input to the bias modulation circuit. According to some embodiments, the separate supply voltage filter is programmable. In accordance with various embodiments, the modulator further includes a plurality of switches each electrically connected between a corresponding one of the plurality of regulated voltages and the output.

In some embodiments, the power management circuit further includes a programmable supply voltage filter operable to filter the power amplifier supply voltage to generate a filtered power amplifier supply voltage that serves as an input to the bias modulation circuit. According to a number of embodiments, the programmable supply voltage filter is implemented as a low pass filter having a controllable corner frequency.

In various embodiments, the power amplifier includes a first power amplifier stage and a second power amplifier stage arranged in a cascade. According to several embodiments, the bias modulation circuit is configured to generate a bias signal for the second power amplifier stage and the second power amplifier stage is powered by the power amplifier supply voltage. In accordance with a number of embodiments, a bias of the first power amplifier stage is substantially fixed. According some embodiments, both the first power amplifier stage and the second power amplifier stage are powered by the power amplifier supply voltage. In accordance with several embodiments, the bias modulation circuit is configured to generate a first bias signal that biases the first power amplifier stage and a second bias signal that biases the second power amplifier stage. According to a number of embodiments, the bias modulation circuit is operable to increase the first bias signal and decrease the second bias signal in response to the envelope tracker decreasing the voltage level of the power amplifier supply voltage. In accordance with some embodiments, the first power amplifier stage includes a first bipolar transistor having a base biased by the first bias signal and a collector that receives the power amplifier supply voltage, and a second bipolar transistor having a base biased by the second bias signal and a collector that receives the power amplifier supply voltage.

In various embodiments, at least one of the first power amplifier stage or the second power amplifier stage includes a cascode transistor. According to a number of embodiments, the power management circuit further includes a cascode bias circuit configured to modulate a bias the cascode transistor. In accordance with several embodiments, the cascode bias transistor is configured to modulate the bias of the cascode transistor based on the envelope signal.

In several embodiments, the mobile device further includes a battery operable to provide a battery voltage to the envelope tracker.

In some embodiments, the mobile device further includes an antenna configured to radiate a transmit wave in response to receiving an amplified radio frequency signal from the power amplifier.

In certain embodiments, the present disclosure relates to a method of envelope tracking. The method includes amplifying a radio frequency signal using a power amplifier, and generating a power amplifier supply voltage of the power amplifier based on an envelope signal using an envelope tracker, the envelope signal indicating an envelope of the radio frequency signal, and the envelope tracker having a modulation bandwidth less than a full bandwidth of the radio frequency signal. The method further includes modulating a bias of the power amplifier based on a voltage level of the power amplifier supply voltage using a bias modulation circuit.

In a number of embodiments, the modulation bandwidth of the envelope tracker is less than 100 megahertz.

In various embodiments, the modulation bandwidth of the envelope tracker is less than 20 megahertz.

In several embodiments, the envelope signal is shaped.

In some embodiments, the method further includes generating a digital transmit signal using a digital pre-distortion system, and processing the digital transmit signal to generate the radio frequency signal using a modulator. According to a number of embodiments, the method further includes generating a supply voltage modeling signal estimating the voltage level of the power amplifier supply voltage at the power amplifier, and digitally pre-distorting the digital transmit signal based on the supply voltage modeling signal. In accordance with several embodiments, modulating the bias of the power amplifier includes modulating a bias of at least one cascode transistor of the power amplifier.

In several embodiments, generating the power amplifier supply voltage includes generating a plurality of regulated voltages of different voltage levels using a multi-level supply DC-to-DC converter, and modulating the plurality of regulated voltages based on the envelope of the radio frequency signal to generate the power amplifier supply voltage using a modulator. According to a number of embodiments, the method further includes filtering the power amplifier supply voltage using a passive filter of the envelope tracker. In accordance with various embodiments, the method further includes providing the bias modulation circuit the power amplifier supply voltage from an output of the modulator prior to filtering by the passive filter, and providing the power amplifier supply voltage to the power amplifier after filtering by the passive filter.

In some embodiments, the method further includes filtering the power amplifier supply voltage to generate a filtered power amplifier supply voltage that serves as an input to the bias modulation circuit using a programmable supply voltage filter.

In various embodiments, modulating the bias of the power amplifier includes generating a first bias signal for a first power amplifier stage of the power amplifier and a second bias signal for a second power amplifier stage of the power amplifier. According to a number of embodiments, the method further includes increasing the first bias signal and decreasing the second bias signal in response to the envelope tracker decreasing the voltage level of the power amplifier supply voltage.

In certain embodiments, the present disclosure relates to an envelope tracking system. The envelope tracking system includes a power amplifier configured to amplify a radio frequency signal, a multi-level supply envelope tracker configured to generate a power amplifier supply voltage of the power amplifier based on an envelope signal indicating an envelope of the radio frequency signal, and a bias modulation circuit configured to modulate a bias of the power amplifier based on a voltage level of the power amplifier supply voltage.

In various embodiments, the multi-level supply envelope tracker has a modulation bandwidth less than a full bandwidth of the radio frequency signal.

In some embodiments, the modulation bandwidth of the multi-level supply envelope tracker is less than 100 megahertz. According to a number of embodiments, the modulation bandwidth of the multi-level supply envelope tracker is less than 20 megahertz.

In several embodiments, the envelope signal is shaped.

In various embodiments, the envelope tracking system further includes a digital pre-distortion system configured to generate a digital transmit signal, and a modulator configured to generate the radio frequency signal based on the digital transmit signal. According to a number of embodiments, the envelope tracking system further includes a power amplifier supply voltage digital filter model configured to generate a supply voltage modeling signal estimating the voltage level of the power amplifier supply voltage at the power amplifier, the digital pre-distortion system operable to digitally pre-distort the digital transmit signal based on the supply voltage modeling signal.

In some embodiments, the bias modulation circuit is configured to modulate a bias of at least one cascode transistor of the power amplifier. According to a number of embodiments, the multi-level supply envelope tracker includes a multi-level supply DC-to-DC converter configured to generate a plurality of regulated voltages of different voltage levels, a modulator configured to receive the plurality of regulated voltages and having an output configured to control the voltage level of the power amplifier supply voltage, and a control circuit configured to control the modulator based on the envelope signal. In accordance with several embodiments, the multi-level supply envelope tracker further includes a passive filter interposed between the output of the modulator and a supply input to the power amplifier. According to various embodiments, the bias modulation circuit receives the power amplifier supply voltage from the output of the modulator prior to filtering by the passive filter, and the power amplifier receives the power amplifier supply voltage after filtering by the passive filter. In accordance with a number of embodiments, the envelope tracking system further includes a separate supply voltage filter operable to filter the power amplifier supply voltage to generate a filtered power amplifier supply voltage that serves as an input to the bias modulation circuit. According to several embodiments, the separate supply voltage filter is programmable. In accordance with various embodiments, the modulator further includes a plurality of switches each electrically connected between a corresponding one of the plurality of regulated voltages and the output.

In several embodiments, the envelope tracking system further includes a programmable supply voltage filter operable to filter the power amplifier supply voltage to generate a filtered power amplifier supply voltage that serves as an input to the bias modulation circuit. According to a number of embodiments, the programmable supply voltage filter is implemented as a low pass filter having a controllable corner frequency.

In various embodiments, the power amplifier includes a first power amplifier stage and a second power amplifier stage arranged in a cascade. According to a number of embodiments, the bias modulation circuit is configured to generate a bias signal for the second power amplifier stage and the second power amplifier stage is powered by the power amplifier supply voltage. In accordance with several embodiments, a bias of the first power amplifier stage is substantially fixed. According to some embodiments, both the first power amplifier stage and the second power amplifier stage are powered by the power amplifier supply voltage. In accordance with a number of embodiments, the bias modulation circuit is configured to generate a first bias signal that biases the first power amplifier stage and a second bias signal that biases the second power amplifier stage. According to several embodiments, the bias modulation circuit is operable to increase the first bias signal and decrease the second bias signal in response to the multi-level supply envelope tracker decreasing the voltage level of the power amplifier supply voltage. In accordance with some embodiments, the first power amplifier stage includes a first bipolar transistor having a base biased by the first bias signal and a collector that receives the power amplifier supply voltage, and a second bipolar transistor having a base biased by the second bias signal and a collector that receives the power amplifier supply voltage. According to a number of embodiments, at least one of the first power amplifier stage or the second power amplifier stage includes a cascode transistor. In accordance with several embodiments, the envelope tracking system further includes a cascode bias circuit configured to modulate a bias the cascode transistor. According to some embodiments, the cascode bias transistor is configured to modulate the bias of the cascode transistor based on the envelope signal.

In accordance with various embodiments, the envelope tracking system is implemented on a packaged module.

In certain embodiments, the present disclosure relates to a mobile device. The mobile device includes a transceiver configured to generate a radio frequency signal, a front end circuit including a power amplifier configured to amplify the radio frequency signal, and a power management circuit including a multi-level supply envelope tracker configured to generate a power amplifier supply voltage of the power amplifier based on an envelope signal indicating an envelope of the radio frequency signal, and a bias modulation circuit configured to modulate a bias of the power amplifier based on a voltage level of the power amplifier supply voltage.

In several embodiments, the multi-level supply envelope tracker has a modulation bandwidth less than a full bandwidth of the radio frequency signal.

In some embodiments, the modulation bandwidth of the multi-level supply envelope tracker is less than 100 megahertz. According to a number of embodiments, the modulation bandwidth of the multi-level supply envelope tracker is less than 20 megahertz.

In various embodiments, the envelope signal is shaped.

In several embodiments, the mobile device further includes a digital processing circuit including a digital pre-distortion system configured to generate a digital transmit signal, the transceiver including a modulator configured to generate the radio frequency signal based on the digital transmit signal. According to a number of embodiments, the digital processing circuit further includes a power amplifier supply voltage digital filter model configured to generate a supply voltage modeling signal estimating the voltage level of the power amplifier supply voltage at the power amplifier, the digital pre-distortion system operable to digitally pre-distort the digital transmit signal based on the supply voltage modeling signal.

In various embodiments, the bias modulation circuit is configured to modulate a bias of at least one cascode transistor of the power amplifier.

In some embodiments, the multi-level supply envelope tracker includes a multi-level supply DC-to-DC converter configured to generate a plurality of regulated voltages of different voltage levels, a modulator configured to receive the plurality of regulated voltages and having an output configured to control the voltage level of the power amplifier supply voltage, and a control circuit configured to control the modulator based on the envelope signal. According to a number of embodiments, the multi-level supply envelope tracker further includes a passive filter interposed between the output of the modulator and a supply input to the power amplifier. In accordance with several embodiments, the bias modulation circuit receives the power amplifier supply voltage from the output of the modulator prior to filtering by the passive filter, and the power amplifier receives the power amplifier supply voltage after filtering by the passive filter. According to various embodiments, the power management circuit further includes a separate supply voltage filter operable to filter the power amplifier supply voltage to generate a filtered power amplifier supply voltage that serves as an input to the bias modulation circuit. In accordance with a number of embodiments, the separate supply voltage filter is programmable. According to several embodiments, the modulator further includes a plurality of switches each electrically connected between a corresponding one of the plurality of regulated voltages and the output.

In various embodiments, the power management circuit further includes a programmable supply voltage filter operable to filter the power amplifier supply voltage to generate a filtered power amplifier supply voltage that serves as an input to the bias modulation circuit. According to a number of embodiments, the programmable supply voltage filter is implemented as a low pass filter having a controllable corner frequency.

In several embodiments, the power amplifier includes a first power amplifier stage and a second power amplifier stage arranged in a cascade. According to a number of embodiments, the bias modulation circuit is configured to generate a bias signal for the second power amplifier stage and the second power amplifier stage is powered by the power amplifier supply voltage. In accordance with various embodiments, a bias of the first power amplifier stage is substantially fixed. According to some embodiments, both the first power amplifier stage and the second power amplifier stage are powered by the power amplifier supply voltage. In accordance with a number of embodiment, the bias modulation circuit is configured to generate a first bias signal that biases the first power amplifier stage and a second bias signal that biases the second power amplifier stage. According to various embodiments, the bias modulation circuit is operable to increase the first bias signal and decrease the second bias signal in response to the multi-level supply envelope tracker decreasing the voltage level of the power amplifier supply voltage. In accordance with several embodiments, the first power amplifier stage includes a first bipolar transistor having a base biased by the first bias signal and a collector that receives the power amplifier supply voltage, and a second bipolar transistor having a base biased by the second bias signal and a collector that receives the power amplifier supply voltage. According to a number of embodiments, at least one of the first power amplifier stage or the second power amplifier stage includes a cascode transistor. In accordance with various embodiments, the power management circuit further includes a cascode bias circuit configured to modulate a bias the cascode transistor. According to several embodiments, the cascode bias transistor is configured to modulate the bias of the cascode transistor based on the envelope signal.

In various embodiments, the mobile device further includes a battery operable to provide a battery voltage to the multi-level switching circuit.

In several embodiments, the mobile device further includes an antenna configured to radiate a transmit wave in response to receiving an amplified radio frequency signal from the power amplifier.

In certain embodiments, the present disclosure relates to a method of envelope tracking. The method includes amplifying a radio frequency signal using a power amplifier, generating a power amplifier supply voltage of the power amplifier based on an envelope signal using a multi-level supply envelope tracker, the envelope signal indicating an envelope of the radio frequency signal, and modulating a bias of the power amplifier based on a voltage level of the power amplifier supply voltage using a bias modulation circuit.

In various embodiments, the modulation bandwidth of the multi-level supply envelope tracker is less than 100 megahertz. According to a number of embodiments, the modulation bandwidth of the multi-level supply envelope tracker is less than 20 megahertz.

In several embodiments, the envelope signal is shaped.

In some embodiments, the method further includes generating a digital transmit signal using a digital pre-distortion system, and processing the digital transmit signal to generate the radio frequency signal using a modulator. According to a number of embodiments, the method further includes generating a supply voltage modeling signal estimating the voltage level of the power amplifier supply voltage at the power amplifier, and digitally pre-distorting the digital transmit signal based on the supply voltage modeling signal.

In various embodiments, modulating the bias of the power amplifier includes modulating a bias of at least one cascode transistor of the power amplifier.

In several embodiments, generating the power amplifier supply voltage includes generating a plurality of regulated voltages of different voltage levels using a multi-level supply DC-to-DC converter, and modulating the plurality of regulated voltages based on the envelope signal to generate the power amplifier supply voltage using a modulator. According to a number of embodiments, the method further includes filtering the power amplifier supply voltage using a passive filter of the multi-level supply envelope tracker. In accordance with various embodiments, the method further includes providing the bias modulation circuit the power amplifier supply voltage from an output of the modulator prior to filtering by the passive filter, and providing the power amplifier supply voltage to the power amplifier after filtering by the passive filter.

In some embodiments, the method further includes filtering the power amplifier supply voltage to generate a filtered power amplifier supply voltage that serves as an input to the bias modulation circuit using a programmable supply voltage filter.

In various embodiments, modulating the bias of the power amplifier includes generating a first bias signal for a first power amplifier stage of the power amplifier and a second bias signal for a second power amplifier stage of the power amplifier. According to several embodiments, the method further includes increasing the first bias signal and decreasing the second bias signal in response to the multi-level supply envelope tracker decreasing the voltage level of the power amplifier supply voltage.

DETAILED DESCRIPTION OF EMBODIMENTS

Figure 1:
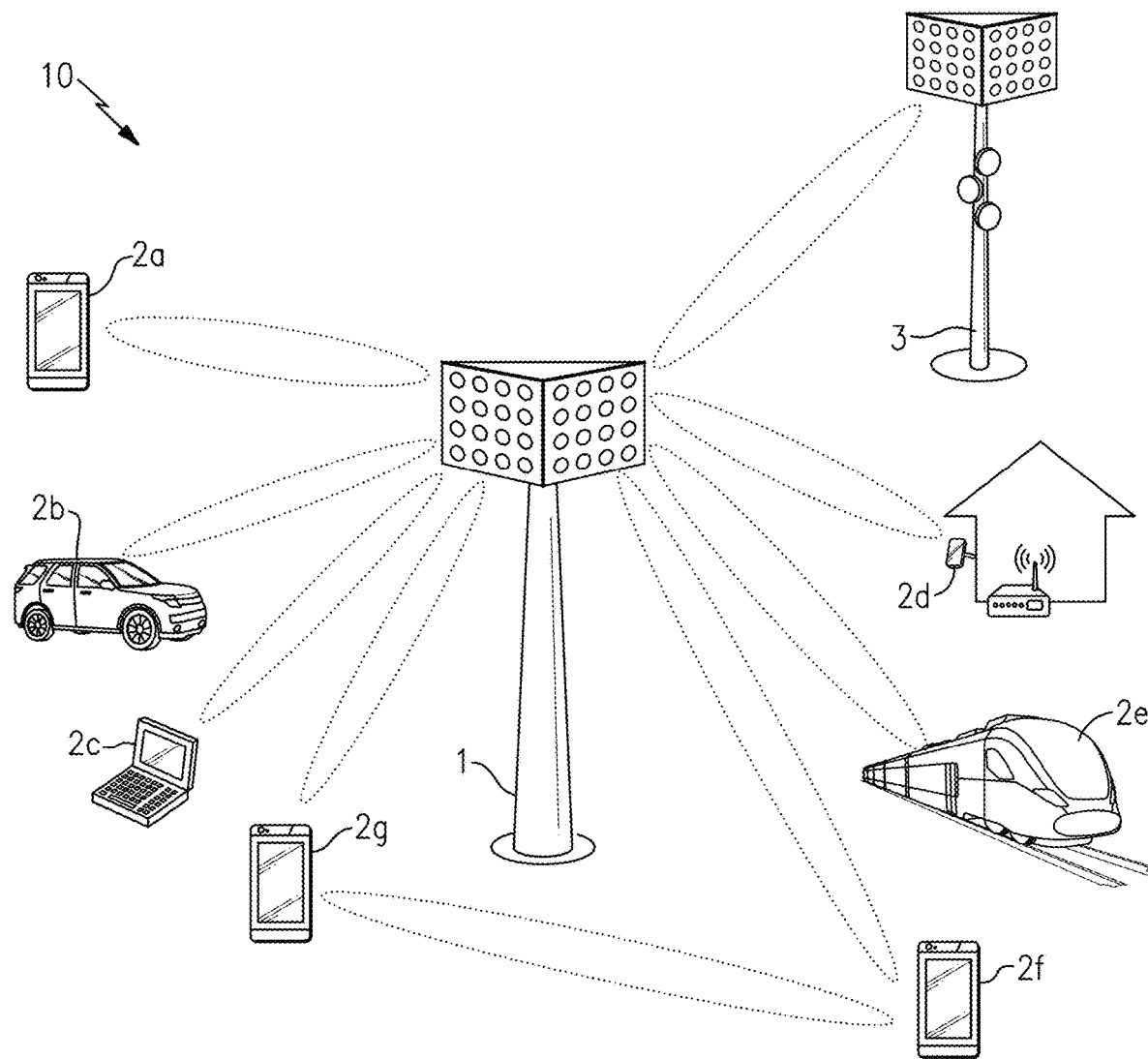
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2020). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Power Amplifier Bias Modulation for Low Bandwidth Envelope Tracking

Envelope tracking (ET) is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Apparatus and methods for power amplifier bias modulation for low bandwidth envelope tracking are provided herein. In certain embodiments, an envelope tracking system includes a power amplifier that amplifies an RF signal and a low bandwidth envelope tracker that generates a power amplifier supply voltage for the power amplifier based on an envelope of the RF signal. The envelope tracking system further includes a bias modulation circuit that modulates a bias signal of the power amplifier based on a voltage level of the power amplifier supply voltage.

Accordingly, the low bandwidth envelope tracker controls the voltage level of the power amplifier supply voltage based on the envelope of the RF signal, and the bias modulation circuit modulates the bias signal of the power amplifier based on the voltage level of the power amplifier supply voltage.

By implementing the envelope tracking system in this manner, a bandwidth constraint of the envelope tracker is relaxed, thereby permitting use of an envelope tracker with lower cost and/or smaller size. The low bandwidth of the envelope tracker advantageously provides a reduced bandwidth for noise, mitigation of memory effects, and/or reduced sensitivity to a time delay between the RF signal and corresponding changes in the power amplifier supply voltage.

The bandwidth of the low bandwidth envelope tracker can be any suitable amount, for instance, less than the bandwidth of the RF signal amplified by the power amplifier. In certain embodiments, the low bandwidth envelope tracker operates with a bandwidth of less than 100 MHz (for instance, for 5G NR signals of 100 MHz bandwidth), or more particularly, 20 MHz or less. In contrast, certain envelope trackers operate with 150 MHz or more of modulation bandwidth. Thus, bias modulation can provide a significant reduction in bandwidth constraints of an envelope tracker.

In certain implementations, the envelope tracking system further includes a programmable supply voltage filter that filters the power amplifier supply voltage to generate a filtered power amplifier supply voltage that serves as an input to the bias modulation circuit. For example, a control signal to a programmable capacitor or other configurable filter circuitry can be used to control an amount of filtering provided to the power amplifier supply voltage.

By implementing the envelope tracking system in this manner, enhanced flexibility can be achieved and/or isolation from noise of the power amplifier supply voltage can be realized. For example, controlling the amount of filtering provided by the programmable supply voltage filter can aid in achieving a desired amount of bias modulation.

In certain implementations, the low bandwidth envelope tracker is implemented as a multi-level supply (MLS) envelope tracker. For example, the MLS envelope tracker can include an MLS DC-to-DC converter that generates multiple regulated voltages of different voltage levels based on a battery voltage, an MLS modulator including a bank of switches each connected between an output of the MLS envelope tracker and a corresponding one of the regulated voltages, and a control circuit that processes the envelope signal to open or close particular switches of the bank to thereby control the voltage level of the power amplifier supply voltage.

The MLS envelope tracker can also include an output filter, such as a passive conditioning filter, for filtering the power amplifier supply voltage. In certain implementations, the supply voltage outputted by the MLS modulator is provided to the bias modulation circuit, while the output filter is included between the output of the MLS modulator and the power supply input of the power amplifier. Implementing the envelope tracking system in this manner aids in shielding the bias modulation circuit from noise arising from fluctuations in power amplifier current. For example, implementing the envelope tracking system in this manner can provide a cleaner version of the power amplifier supply voltage to the bias modulation circuit.

In certain implementations, the power amplifier includes two or more stages that are powered by the power amplifier supply voltage and/or that have a bias modulated by the bias modulation circuit. For example, the power amplifier can include a first power amplifier stage powered by the power amplifier supply voltage and biased by a first bias signal from the bias modulation circuit, and a second power amplifier stage powered by the power amplifier supply voltage and biased by a second bias signal from the bias modulation circuit.

Implementing the envelope tracking system in this manner can enhance the gain and power consumption performance of the power amplifier. For instance, in response to the envelope tracker decreasing the voltage level of the power amplifier supply voltage, the bias modulation circuit can increase the first bias signal to add gain to compensate for gain spread and decrease the second bias signal to save current.

The power amplifier stages can be implemented in a wide a wide variety of ways. In a first example, a power amplifier stage includes a common emitter bipolar transistor having a base biased by the bias signal from the bias modulation circuit and a collector that receives the power amplifier supply voltage. In a second example, a power amplifier stage includes a common source field effect transistor having a gate biased by the bias signal from the bias modulation circuit and a drain that receives the power amplifier supply voltage. In certain implementations, one or more cascode transistors are included in series with a common emitter bipolar transistor or a common gate field effect transistor.

In implementations in which cascode biasing is used, an input (for instance, a base or gate) of a cascode transistor can also be modulated. For example, the input of the cascode transistor can be modulated based on the envelope of the RF signal to thereby provide further reductions in bandwidth constraints of the envelope tracker.

FIGS. 2-8D are schematic diagram of various embodiments of envelope tracking systems. Although various embodiments of envelope tracking systems are depicted, the teachings herein are applicable to envelope trackers implemented in a wide variety of ways. Accordingly, other implementations are possible.

Figure 2:
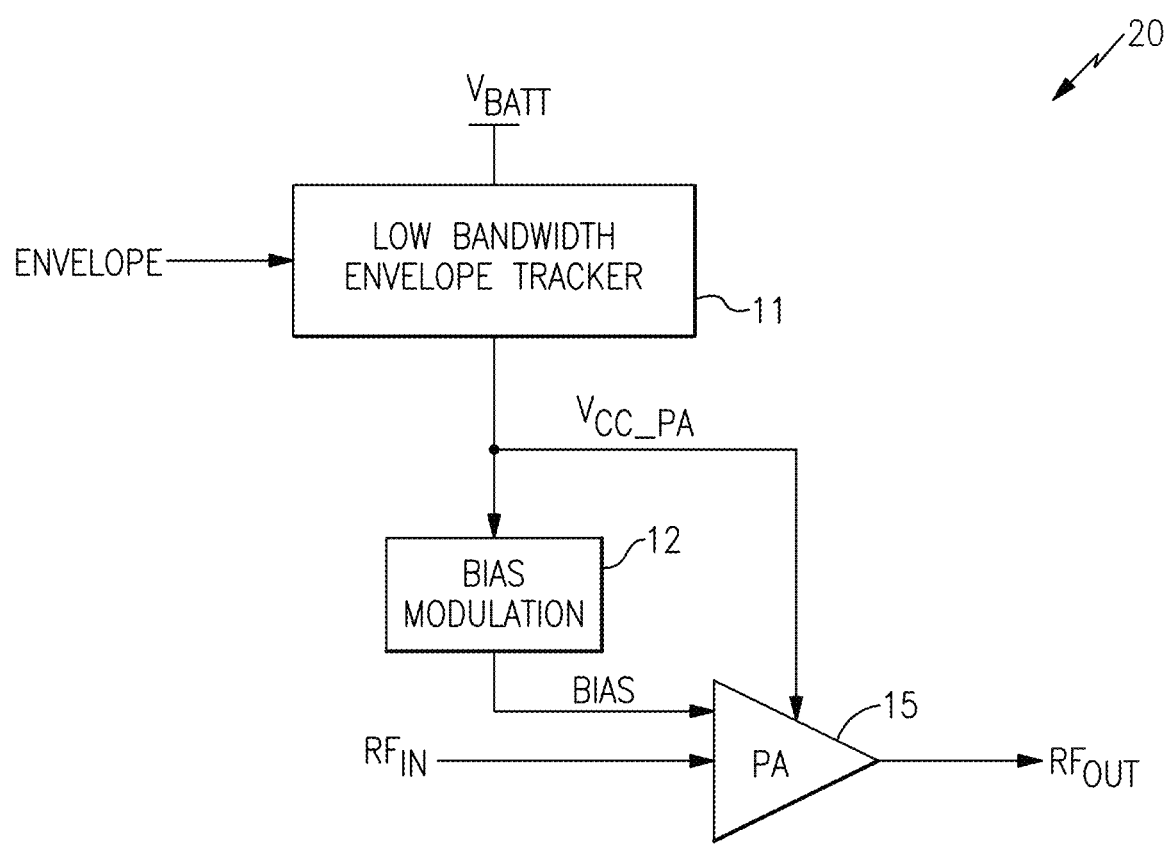
FIG. 2 is a schematic diagram of one embodiment of an envelope tracking system.

FIG. 2 is a schematic diagram of one embodiment of an envelope tracking system 20. The envelope tracking system 20 includes a low bandwidth envelope tracker 11, a bias modulation circuit 12, and a power amplifier 15.

As shown in FIG. 2, the power amplifier 15 amplifies an RF input signal $RF_{IN}$ to generate an RF output signal $RF_{OUT}$. Additionally, the power amplifier 15 receives power from a power amplifier supply voltage $V_{CC\_PA}$, and is biased by a bias signal BIAS. Although shown as receiving one supply voltage and one bias signal, the power amplifier 15 can receive multiple supply voltages and/or multiple bias signals. For example, the power amplifier 15 can be implemented as a multi-stage power amplifier in which different supply voltages and/or different bias signals can be used for at least a portion of the stages. Such bias signal(s) can be applied to transistor inputs, including, but not limited to, a base of a common emitter bipolar transistor, a base of a cascode bipolar transistor, a gate of a common source field effect transistor (FET), and/or a gate of a cascode FET.

In the illustrated embodiment, the low bandwidth envelope tracker generates the power amplifier supply voltage $V_{CC\_PA}$ based on an envelope signal ENVELOPE indicating an envelope of the RF input signal $RF_{IN}$. Thus, the power amplifier supply voltage $V_{CC\_PA}$ changes in relation to the envelope of the RF input signal $RF_{IN}$ amplified by the power amplifier 15.

The envelope tracker 11 is low bandwidth, for instance, operates with a modulation bandwidth less than a full bandwidth of the RF input signal $RF_{IN}$. For example, the RF input signal $RF_{IN}$ can include a number of allocated resource blocks (RBs) that can vary with each transmission, and the modulation bandwidth of the envelope tracker 11 can be less than the bandwidth of the RF input signal $RF_{IN}$ when carrying the maximum allowable number of RBs permitted by the communication standard (for instance, 5G NR).

In certain implementations, the modulation bandwidth of the envelope tracker 11 is less than 100 MHz, or more particularly, less than 20 MHz. The envelope tracker 11 can be implemented in a wide variety of ways, including, but not limited to, as an MLS envelope tracker.

With continuing reference to FIG. 2, the bias modulation circuit 12 generates the bias signal BIAS for the power amplifier 15. For example, the bias modulation circuit 12 operates to modulate the bias signal BIAS based on the voltage level of the power amplifier supply voltage $V_{CC\_PA}$, thereby relaxing a bandwidth constraint for envelope tracking.

Lowering the bandwidth of the envelope tracker 11 not only can lower cost and/or reduce area, but also reduce bandwidth for noise. Moreover, the low bandwidth envelope tracker 11 operates with less risk of noise and/or memory effects. Furthermore, the low bandwidth envelope tracker 11 can exhibit enhanced robustness to presence of and/or variation in delay between the RF input signal $RF_{IN}$ and the power amplifier supply voltage $V_{CC\_PA}$.

Moreover, using lower bandwidth for the envelope tracker allows the power amplifier supply voltage and the power amplifier bias to be time advanced relative to the RF signal. Thus, the envelope tracking system can be prepared for fast varying signal power peaks. This in turn reduces memory effects, since the power amplifier can be adjusted in time for changes to the RF signal (for instance, for the next incoming signal for transmission).

Any of the embodiments herein can be implemented with the low bandwidth envelope tracker 11.

Figure 3A:
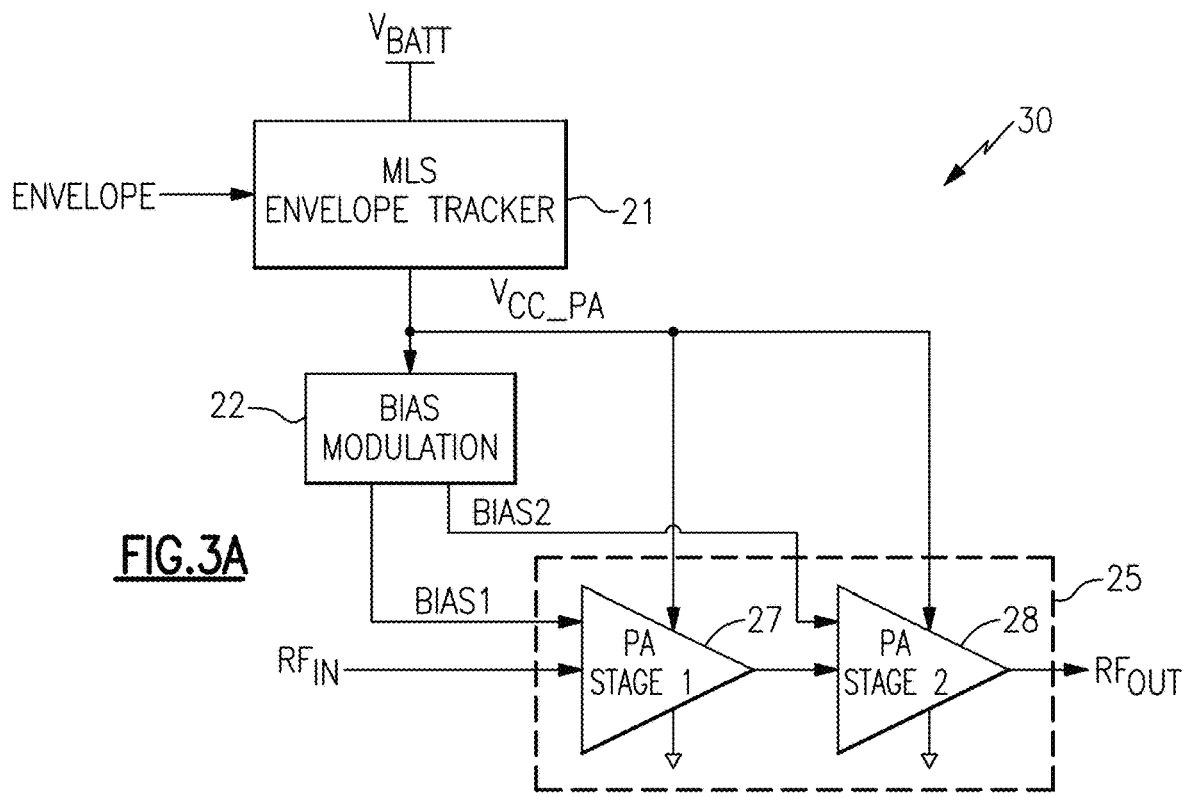
FIG. 3A is a schematic diagram of another embodiment of an envelope tracking system.

FIG. 3A is a schematic diagram of another embodiment of an envelope tracking system 30. The envelope tracking system 30 includes an MLS envelope tracker 21, a bias modulation circuit 22, and a power amplifier 25.

As shown in FIG. 3A, the power amplifier 25 amplifies an RF input signal $RF_{IN}$ to generate an RF output signal $RF_{OUT}$. In this example, the power amplifier 25 includes a first power amplifier stage 27 and a second power amplifier stage 28. Although depicted as including two stages, the power amplifier 25 can include more or fewer stages.

In the illustrated embodiment, the first power amplifier stage 27 and the second power amplifier stage 28 each receive power from the power amplifier supply voltage $V_{CC\_PA}$. However, other implementations are possible, for instance, configurations in which the first power amplifier stage 27 and the second power amplifier stage 28 receive separate power amplifier supply voltages.

The MLS envelope tracker 21 receives a battery voltage $V_{BATT}$ and generates the power amplifier supply voltage $V_{CC\_PA}$ based on an envelope signal ENVELOPE indicating an envelope of the RF input signal $RF_{IN}$. Thus, the power amplifier supply voltage $V_{CC\_PA}$ changes in relation to the envelope of the RF input signal $RF_{IN}$ amplified by the power amplifier 25.

The MLS envelope tracker 21 can be implemented in a wide variety of ways. In certain implementations, the MLS envelope tracker 21 includes an MLS DC-to-DC converter that generates multiple regulated voltages of different voltage levels, an MLS modulator including a bank of switches each connected between an output of the MLS envelope tracker 21 and a corresponding one of the regulated voltages, and a control circuit that processes the envelope signal ENV to open or close particular switches of the bank to thereby generate the power amplifier supply voltage $V_{CC\_PA}$.

With continuing reference to FIG. 3A, the first power amplifier stage 27 is biased by a first bias signal BIAS1, and the second power amplifier stage 28 is biased by a second bias signal BIAS2. Additionally, the bias modulation circuit 21 generates both the first bias signal BIAS1 and the second bias signal BIAS2. Although an example is depicted in which two bias signals are modulated based on the power amplifier supply voltage $V_{CC\_PA}$, the teachings herein are applicable to configurations in which more or fewer power amplifier bias signals are modulated.

In the illustrated embodiment, the power amplifier supply voltage $V_{CC\_PA}$ serves to modulate the bias of both the first power amplifier stage 27 and the second power amplifier stage 28. Modulating the bias in this manner reduces the modulation bandwidth of the MLS envelope tracker 21, which in turn reduces risk of noise injection and/or memory effects.

Figure 3B:
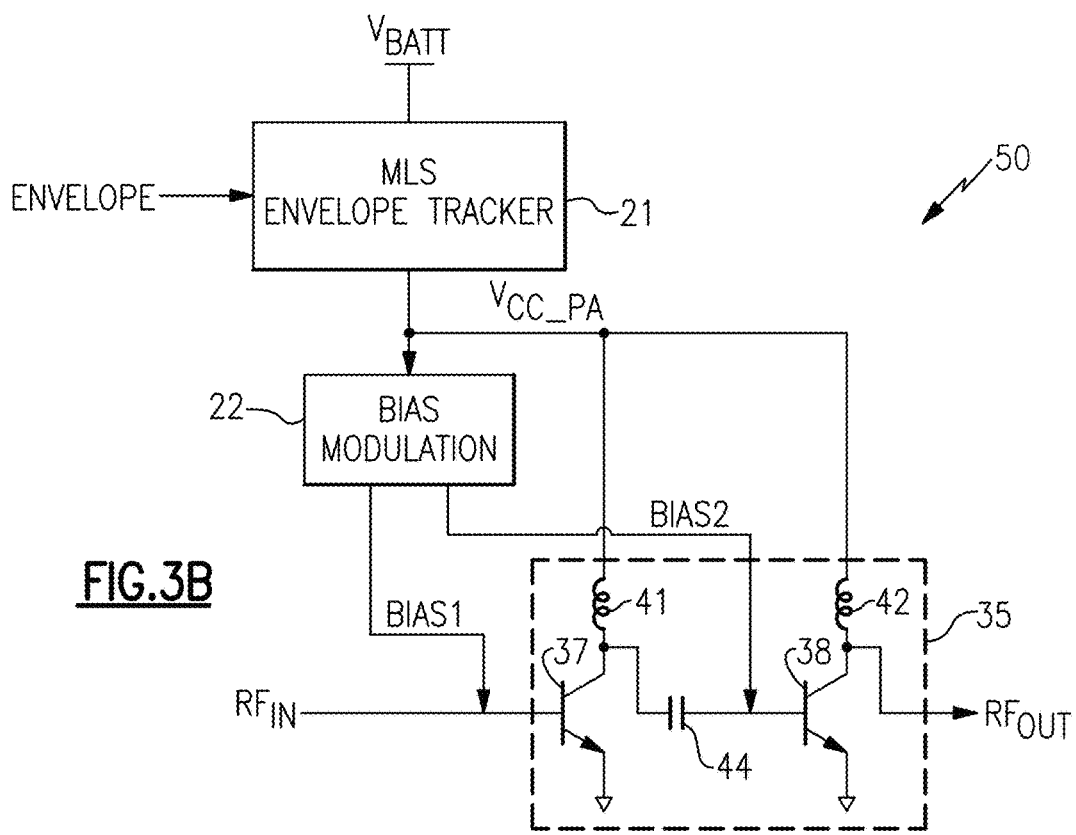
FIG. 3B is a schematic diagram of another embodiment of an envelope tracking system.

FIG. 3B is a schematic diagram of another embodiment of an envelope tracking system 50. The envelope tracking system 50 includes an MLS envelope tracker 21, a bias modulation circuit 22, and a power amplifier 35.

The envelope tracking system 50 of FIG. 3B is similar to the envelope tracking system 30 of FIG. 3A, except that FIG. 3B depicts one implementation of power amplifier circuitry for implementing the first power amplifier stage 27 and the second power amplifier stage 28 of FIG. 3A.

For example, the power amplifier 35 of FIG. 3B includes a first stage bipolar transistor 37, a second stage bipolar transistor 38, a first stage supply inductor 41, a second stage supply inductor 42, and an interstage capacitor 44.

As shown in FIG. 3B, the first bias signal BIAS1 serves as a bias of the base of the first stage bipolar transistor 37, while the power amplifier supply voltage $V_{CC\_PA}$ is provided to the collector of the first stage bipolar transistor 37 by way of the first stage supply inductor 41. Additionally, the second bias signal BIAS2 serves as a bias of the base of the second stage bipolar transistor 38, while the power amplifier supply voltage $V_{CC\_PA}$ is provided to the collector of the second stage bipolar transistor 38 by way of the second stage supply inductor 42.

In the illustrated embodiment, each of the bias signals is provided to a base of a common emitter bipolar transistor. However, other implementations are possible, including, but not limited to, a bias signal applied to a base of a cascode bipolar transistor, a bias signal applied to a gate of a common source FET, and/or a bias signal applied to a gate of a cascode FET.

Although one example of power amplifier circuitry is depicted in FIG. 3B, the teachings here are applicable to power amplifiers implemented in a wide variety of ways.

Figure 4A:
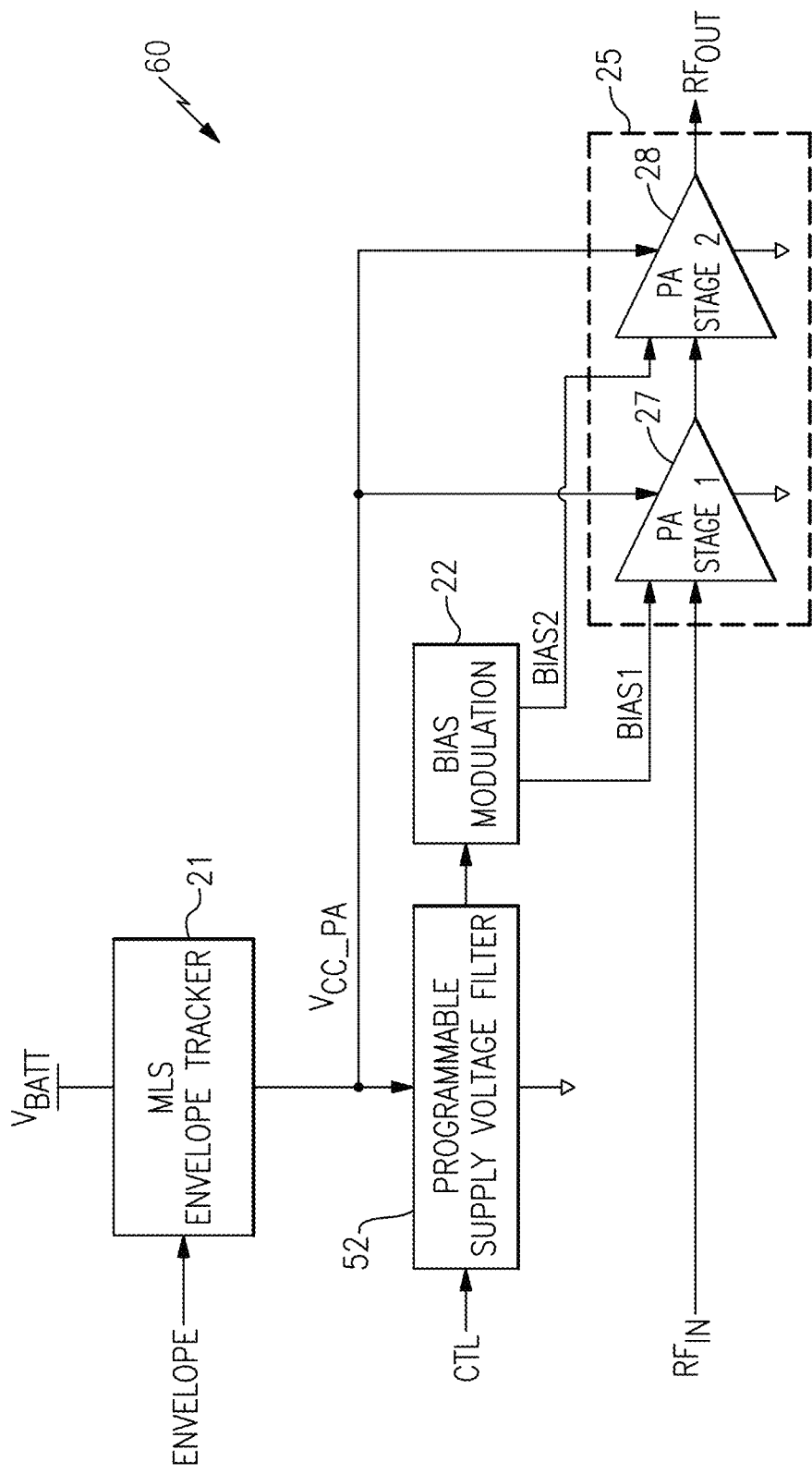
FIG. 4A is a schematic diagram of another embodiment of an envelope tracking system.

FIG. 4A is a schematic diagram of another embodiment of an envelope tracking system 60. The envelope tracking system 60 includes an MLS envelope tracker 21, a bias modulation circuit 22, a power amplifier 25, and a programmable supply voltage filter 52.

The envelope tracking system 60 of FIG. 4A is similar to the envelope tracking system 30 of FIG. 3A, except that the envelope tracking system 60 further includes the programmable supply voltage filter 52.

As shown in FIG. 4A, the programmable supply voltage filter 52 filters the power amplifier supply voltage $V_{CC\_PA}$ to generate a filtered power amplifier supply voltage that serves as an input to the bias modulation circuit 22.

The programmable supply voltage filter 52 receives a control signal CTL that controls an amount of filtering provided to the power amplifier supply voltage $V_{CC\_PA}$. Thus, a desired amount of isolation from noise of the power amplifier supply voltage $V_{CC\_PA}$ can be realized. For example, the amount of filtering can be increased using the control signal CTL to inject less noise into the bias signals at high frequency.

In certain implementations, the envelope tracking system 60 is implemented with compensation for an added delay of the programmable supply voltage filter 52. For example, in certain implementations, delay of the programmable supply voltage filter 52 is programmable (for instance, also using the control signal CTL or using a separate control signal), thereby providing flexibility for not affecting a high bandwidth signal while allowing for good filtration of a lower bandwidth signal with small duplex offsets. For instance, such an internal delay can be less important to adjacent channel leakage ratio (ACLR) performance when a reduced bandwidth envelope tracking signal is already applied to the power amplifier supply voltage $V_{CC\_PA}$.

Figure 4B:
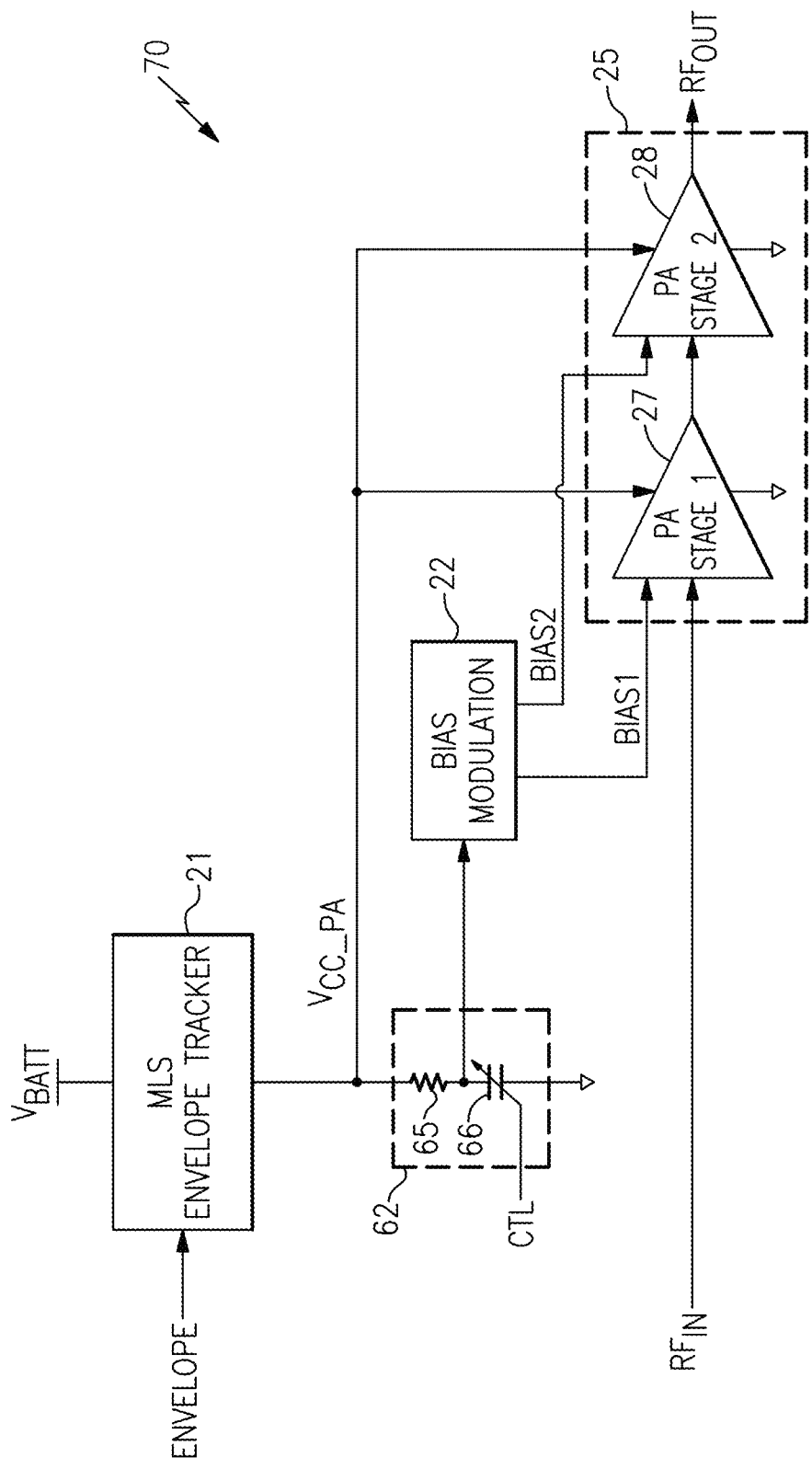
FIG. 4B is a schematic diagram of another embodiment of an envelope tracking system.

FIG. 4B is a schematic diagram of another embodiment of an envelope tracking system 70. The envelope tracking system 70 includes an MLS envelope tracker 21, a bias modulation circuit 22, a power amplifier 25, and a programmable supply voltage filter 62.

The envelope tracking system 70 of FIG. 4B is similar to the envelope tracking system 60 of FIG. 4A, except that the envelope tracking system 70 illustrates a specific implementation of programmable supply voltage filter circuitry.

For example, the programmable supply voltage filter 62 of FIG. 4B includes a resistor 65 and a programmable capacitor 66 in series to operate as a low pass filter to the power amplifier supply voltage $V_{CC\_PA}$. Additionally, the control signal CTL adjusts a capacitance of the capacitor 66, thereby controlling a corner frequency for low pass filtering.

Although one example of programmable supply voltage filter circuitry is depicted in FIG. 4B, a programmable supply voltage filter can be implemented in a wide variety of ways.

Figure 5:
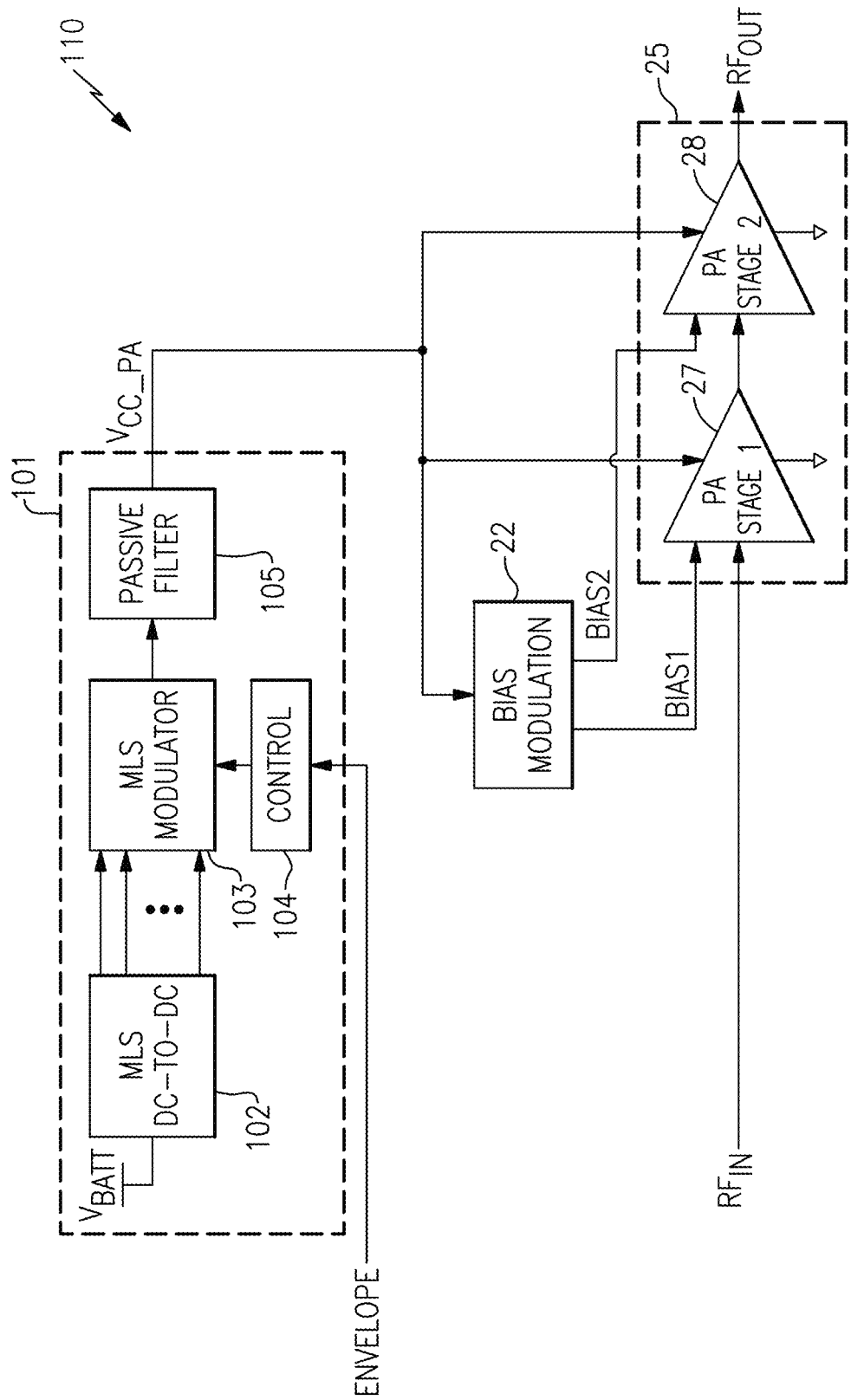
FIG. 5 is a schematic diagram of another embodiment of an envelope tracking system.

FIG. 5 is a schematic diagram of another embodiment of an envelope tracking system 110. The envelope tracking system 110 includes an MLS envelope tracker 101, a bias modulation circuit 22, and a power amplifier 25.

The envelope tracking system 110 of FIG. 5 is similar to the envelope tracking system 30 of FIG. 3A, except that the envelope tracking system 110 illustrates a specific implementation of envelope tracker circuitry.

For example, as shown in FIG. 5, the MLS envelope tracker 101 includes an MLS DC-to-DC converter 102, an MLS modulator 103, a control circuit 104, and a passive filter 105.

The MLS DC-to-DC converter 102 generates multiple regulated voltages of different voltage levels based on a battery voltage $V_{BATT}$. Additionally, the MLS modulator 103 selectively provides one of the regulated voltages to the passive filter 105 based on one or more control signals from the control circuit 104. For instance, the MLS modulator 103 can include a bank of switches each connected between the passive filter 105 and a corresponding one of the regulated voltages. Furthermore, the control circuit 104 can process the envelope signal ENVELOPE to open or close particular switches of the MLS modulator 103 bank to thereby control the voltage level of the power amplifier supply voltage $V_{CC\_PA}$. The passive filter 105 serves to filter or condition the power amplifier supply voltage $V_{CC\_PA}$.

Although one example of MLS envelope tracker circuitry is depicted in FIG. 5, an MLS envelope tracker can be implemented in a wide variety of ways.

Figure 6A:
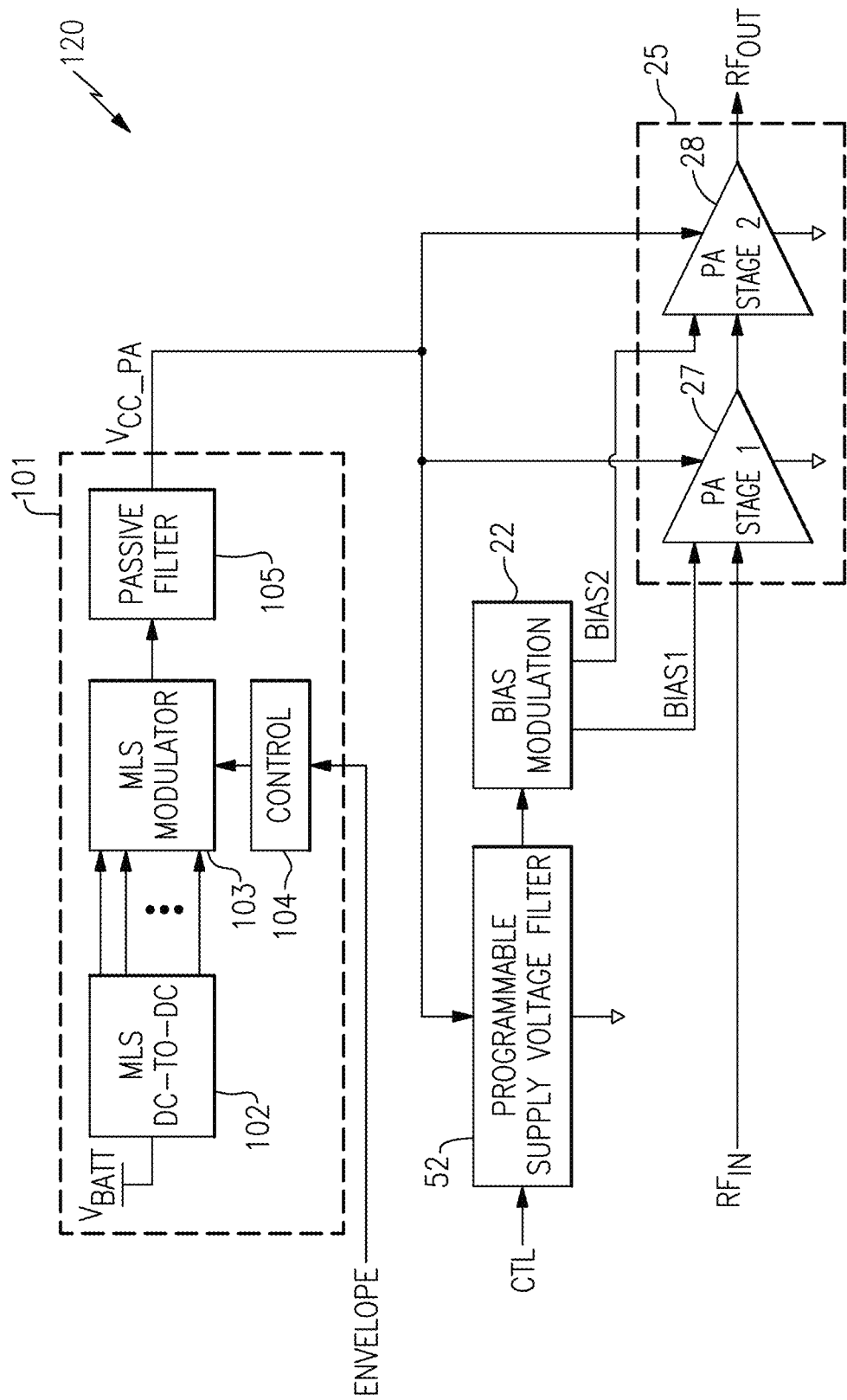
FIG. 6A is a schematic diagram of another embodiment of an envelope tracking system.

FIG. 6A is a schematic diagram of another embodiment of an envelope tracking system 120. The envelope tracking system 120 includes an MLS envelope tracker 101, a bias modulation circuit 22, a power amplifier 25, and a programmable supply voltage filter 52.

The envelope tracking system 120 of FIG. 6A is similar to the envelope tracking system 110 of FIG. 6A, except that the envelope tracking system 120 further includes the programmable supply voltage filter 52.

As shown in FIG. 6A, the programmable supply voltage filter 52 filters the power amplifier supply voltage $V_{CC\_PA}$ to generate a filtered power amplifier supply voltage that serves as an input to the bias modulation circuit 22.

Figure 6B:
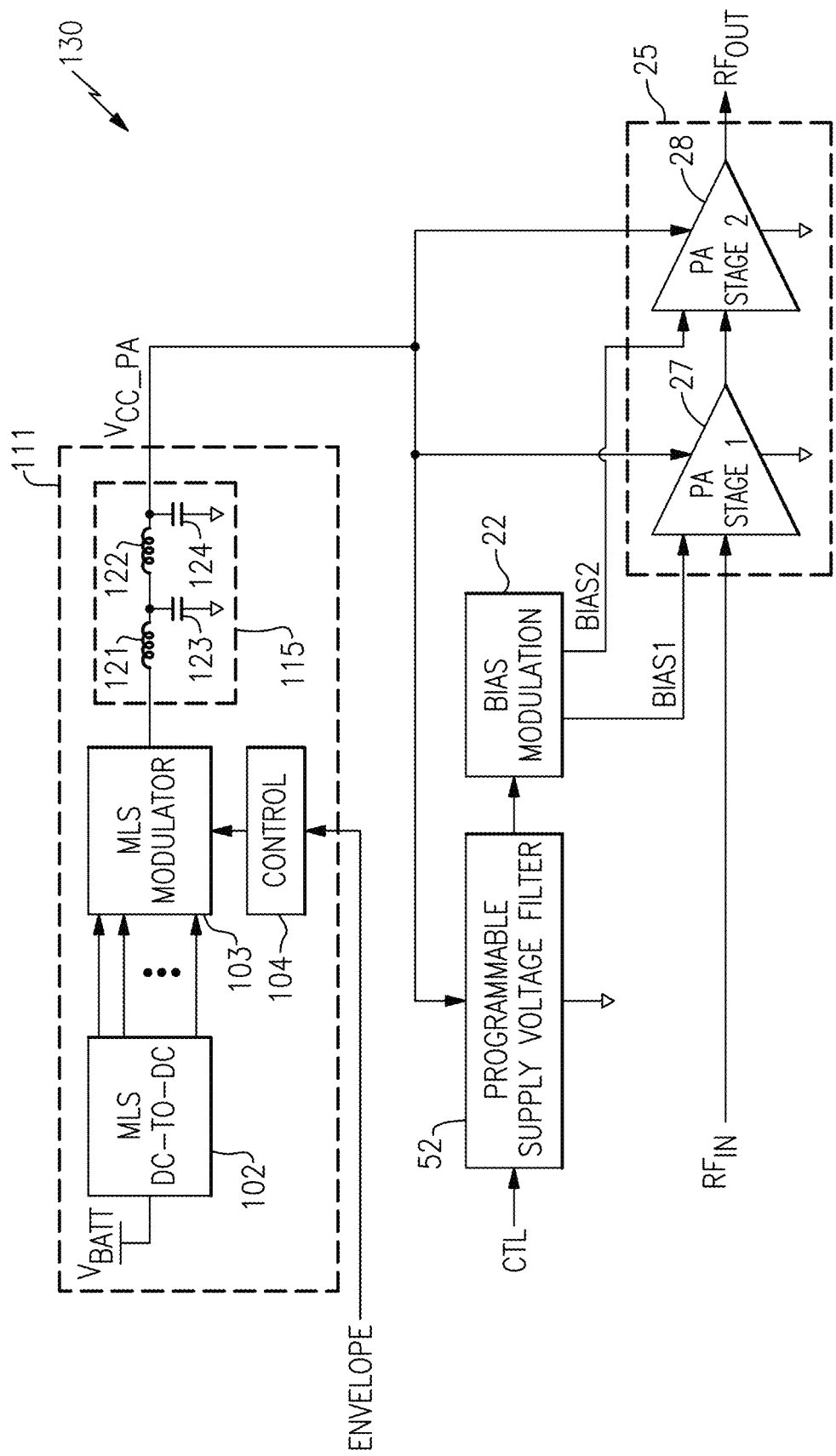
FIG. 6B is a schematic diagram of another embodiment of an envelope tracking system.

FIG. 6B is a schematic diagram of another embodiment of an envelope tracking system 130. The envelope tracking system 130 includes an MLS envelope tracker 111, a bias modulation circuit 22, a power amplifier 25, and a programmable supply voltage filter 52.

As shown in FIG. 6B, the MLS envelope tracker 111 include an MLS DC-to-DC converter 102, an MLS modulator 103, a control circuit 104, and a passive filter 115.

The MLS envelope tracker 111 of FIG. 6B is similar to the MLS envelope tracker 101 of FIG. 6A, except that the MLS envelope tracker 111 illustrates a specific implementation of passive filter circuitry. For example, the passive filter 115 of FIG. 6B includes a first series inductor 121, a second series inductor 122, a first shunt capacitor 123, and a second shunt capacitor 124.

Although one example of passive filter circuitry for an MLS envelope tracker is shown, filter circuitry of an MLS envelope tracker can be implemented in a wide variety of ways.

Figure 7:
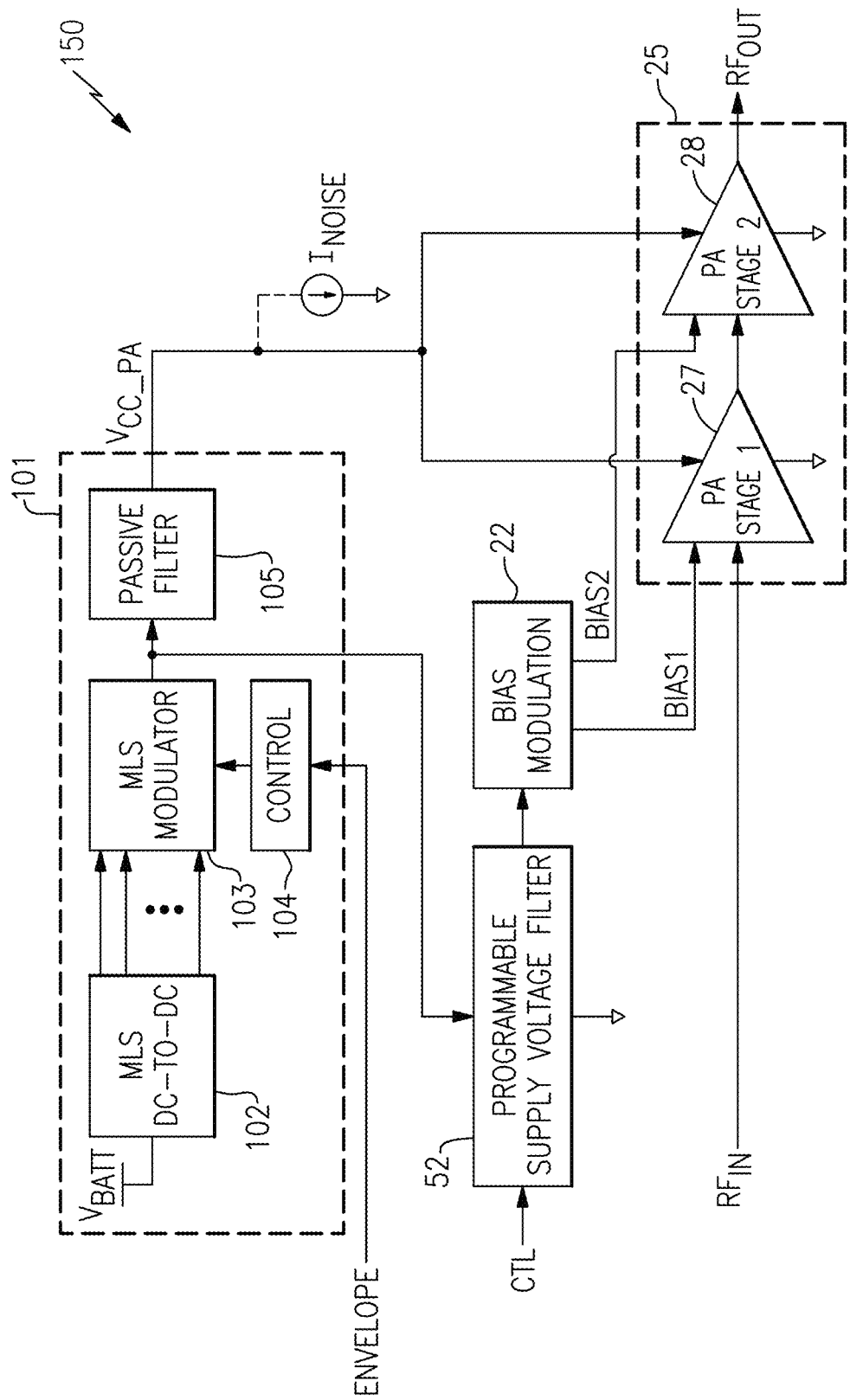
FIG. 7 is a schematic diagram of another embodiment of an envelope tracking system.

FIG. 7 is a schematic diagram of another embodiment of an envelope tracking system 150. The envelope tracking system 150 includes an MLS envelope tracker 101, a bias modulation circuit 22, a power amplifier 25, and a programmable supply voltage filter 52. Additionally, the MLS envelope tracker 101 includes an MLS DC-to-DC converter 102, an MLS modulator 103, a control circuit 104, and a passive filter 105.

The envelope tracking system 150 of FIG. 7 is similar to the envelope tracking system 120 of FIG. 6A, except that the programmable supply voltage filter 52 is coupled to the output of the MLS modulator 103 before the passive filter 105, rather than after the passive filter 105 as in FIG. 6A.

Thus, bias modulation is based on a version of the power amplifier supply voltage prior to filtering by the passive filter 105 while the power amplifier 25 is powered by the power amplifier supply voltage after filtering by the passive filter 105.

Since the noise current NOISE of the power amplifier 25 modulates the power amplifier supply voltage $V_{CC\_PA}$, a cleaner version of power amplifier supply voltage can be obtained by using the output of the MLS modulator 103 prior to filtering by the passive filter 105. Additionally, separate or independent filtering can be provided by the programmable supply voltage filter 52, thereby providing flexibility in generating bias modulation for the power amplifier 25 without contamination of the noise current $I_{NOISE}$ of the power amplifier 25.

Moreover, implementing the envelope tracking system 150 in this manner aids in aligning a delay between the power amplifier supply voltage $V_{CC\_PA}$ provided to the power amplifier 25 and the first bias signal BIAS1 and the second bias signal BIAS2 outputted by the bias modulation circuit 22.

Figure 8A:
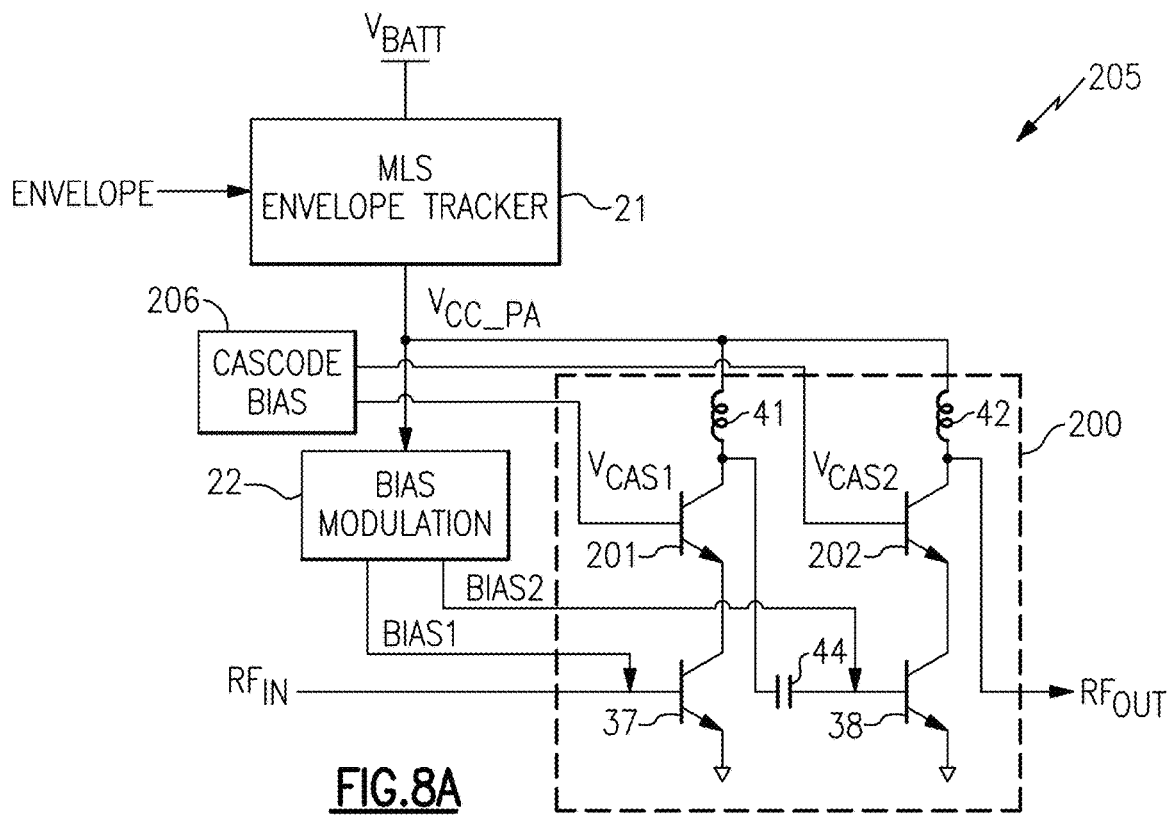
FIG. 8A is a schematic diagram of another embodiment of an envelope tracking system.

FIG. 8A is a schematic diagram of another embodiment of an envelope tracking system 205. The envelope tracking system 205 includes an MLS envelope tracker 21, a bias modulation circuit 22, a power amplifier 200, and a cascode bias circuit 206.

The envelope tracking system 205 of FIG. 8A is similar to the envelope tracking system 30 of FIG. 3A, except that FIG. 8A depicts another implementation of power amplifier circuitry for implementing the first power amplifier stage 27 and the second power amplifier stage 28 of FIG. 3A.

For example, the power amplifier 200 of FIG. 8A includes a first stage bipolar transistor 37, a second stage bipolar transistor 38, a first stage supply inductor 41, a second stage supply inductor 42, an interstage capacitor 44, a first stage cascode transistor 201, and a second stage cascode transistor 202. Additionally, the cascode bias circuit 206 has been included for biasing the first stage cascode transistor 201 and the second stage cascode transistor 202.

As shown in FIG. 8A, the first bias signal BIAS1 serves as a bias of the base of the first stage bipolar transistor 37, while the power amplifier supply voltage $V_{CC\_PA}$ is provided to the collector of the first stage bipolar transistor 37 by way of the first stage supply inductor 41 and the first stage cascode transistor 201. Additionally, the second bias signal BIAS2 serves as a bias of the base of the second stage bipolar transistor 38, while the power amplifier supply voltage $V_{CC\_PA}$ is provided to the collector of the second stage bipolar transistor 38 by way of the second stage supply inductor 42 and the second stage cascode transistor 202. Furthermore, the base of the first stage cascode transistor 201 is biased by a first cascode bias voltage $V_{CAS1}$ from the cascode bias circuit 206, while the base of the second stage cascode transistor 202 is biased by a second cascode bias voltage $V_{CAS2}$ from the cascode bias circuit 206.

In certain implementations, the bias signal to cascode transistor (for instance, the first cascode bias voltage $V_{CAS1}$ and/or the second cascode bias voltage $V_{CAS2}$) has a modulated bias. For example, the cascode bias circuit 206 can receive the envelope signal ENVELOPE and/or the power amplifier supply voltage $V_{CC\_PA}$, and use the envelope signal ENVELOPE and/or the power amplifier supply voltage $V_{CC\_PA}$ to modulate one or more cascode transistor biases.

Although another example of power amplifier circuitry is depicted in FIG. 8A, the teachings here are applicable to power amplifiers implemented in a wide variety of ways.

Figure 8B:
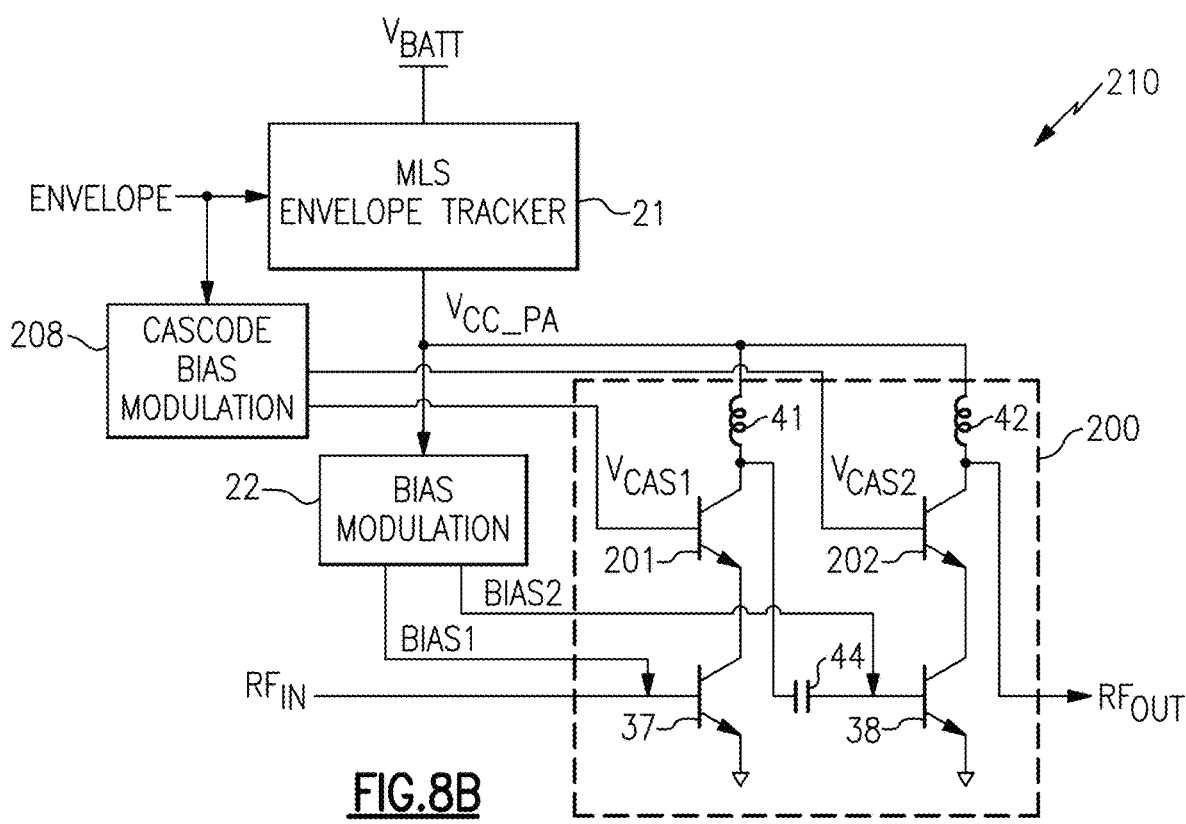
FIG. 8B is a schematic diagram of another embodiment of an envelope tracking system.

FIG. 8B is a schematic diagram of another embodiment of an envelope tracking system 210. The envelope tracking system 210 includes an MLS envelope tracker 21, a bias modulation circuit 22, a power amplifier 200, and a cascode bias modulation circuit 208.

The envelope tracking system 210 of FIG. 8B is similar to the envelope tracking system 205 of FIG. 8A, except that the envelope tracking system 210 includes the cascode bias modulation circuit 208 for modulating the first cascode bias voltage $V_{CAS1}$ and the second cascode bias voltage $V_{CAS2}$. In the illustrated embodiment, the cascode bias modulation circuit 208 provides modulation based on the envelope signal ENVELOPE. In another embodiment, the cascode bias modulation circuit 208 provides modulation based on the power amplifier supply voltage $V_{CC\_PA}$.

Figure 8C:
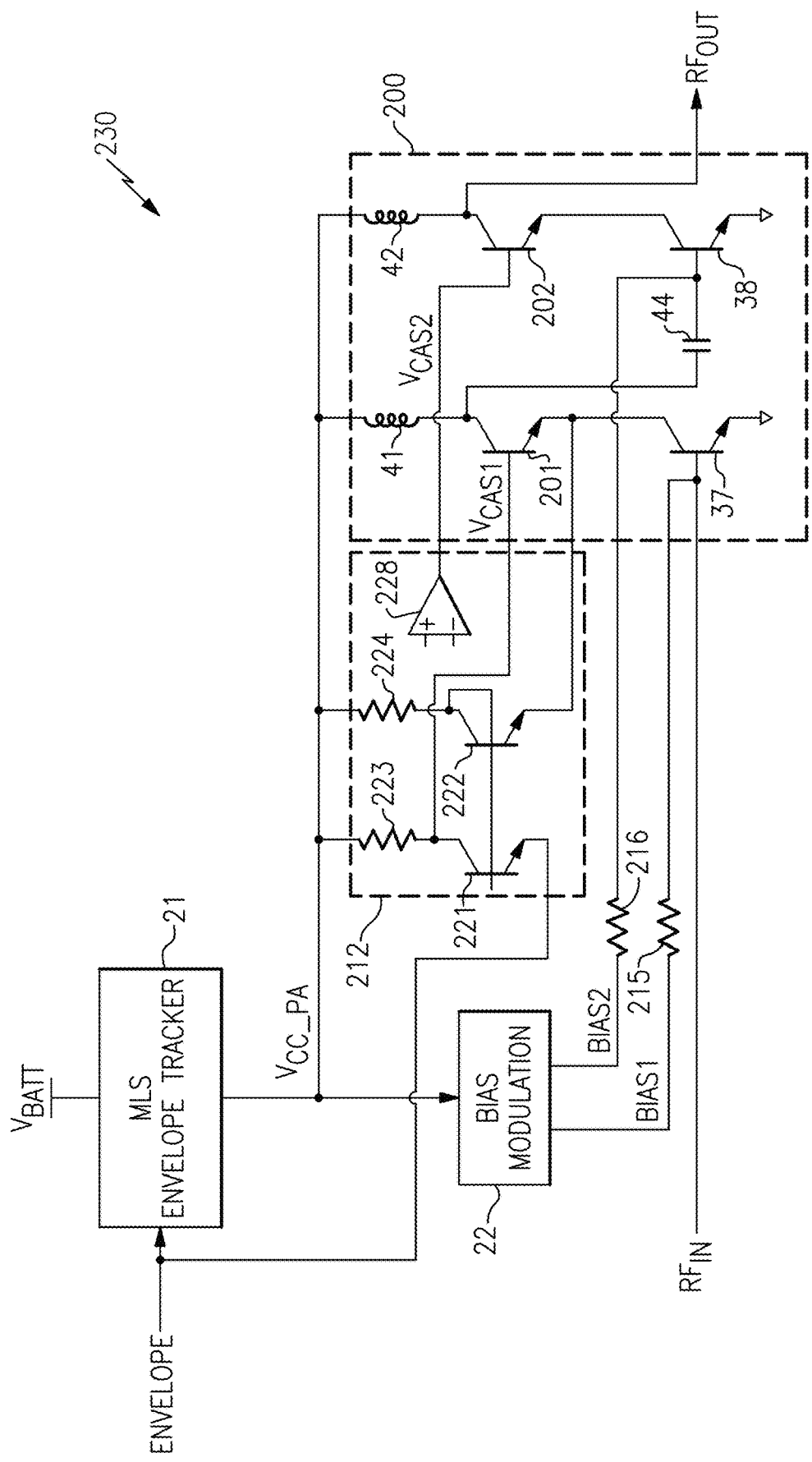
FIG. 8C is a schematic diagram of another embodiment of an envelope tracking system.

FIG. 8C is a schematic diagram of another embodiment of an envelope tracking system 230. The envelope tracking system 230 includes an MLS envelope tracker 21, a bias modulation circuit 22, a power amplifier 200, a cascode bias modulation circuit 212, a first base bias resistor 215, and a second base bias resistor 216.

The envelope tracking system 230 of FIG. 8C is similar to the envelope tracking system 210 of FIG. 8B, except that the envelope tracking system 230 further includes the first base bias resistor 215 and the second base bias resistor 216 and includes a specific implementation of cascode bias modulation circuitry.

As shown in FIG. 8C, the first bias signal BIAS1 is provided to the base of the first stage bipolar transistor 37 by way of the first base bias resistor 215, while the second bias signal BIAS2 is provided to the base of the second stage bipolar transistor 38 by way of the second base bias resistor 216.

In the illustrated embodiment, the cascode bias modulation circuit 212 includes a first cascode bias bipolar transistor 221, a second cascode bias bipolar transistor 222, a first cascode bias resistor 223, a second cascode bias resistor, and a cascode bias amplifier 228.

As shown in FIG. 8C, the emitter of the first cascode bias bipolar transistor 221 receives the envelope signal ENVELOPE, while the emitter of the second cascode bias bipolar transistor 222 is electrically connected to the emitter of the first stage cascode transistor 201. Additionally, a collector of the first cascode bias bipolar transistor 221 generates the first cascode bias voltage $V_{CAS1}$, which is modulated based on the envelope signal ENVELOPE, in this embodiment.

With continuing reference to FIG. 8C, the cascode bias amplifier 228 generates the second cascode bias voltage $V_{CAS2}$. The differential input of the cascode bias amplifier 228 can be connected to provide negative feedback, for instance, by connecting the differential input across a collector-to-base junction of the first cascode bias bipolar transistor 221. For example, such feedback can operate to substantially match the collector-to-base voltage of the second stage cascode transistor 202 to the collector-to-base voltage of the first cascode bias bipolar transistor 221.

Although one embodiment of the cascode bias circuitry is shown, the teachings herein are applicable to cascode bias circuitry implemented in a wide variety of ways.

Figure 8D:
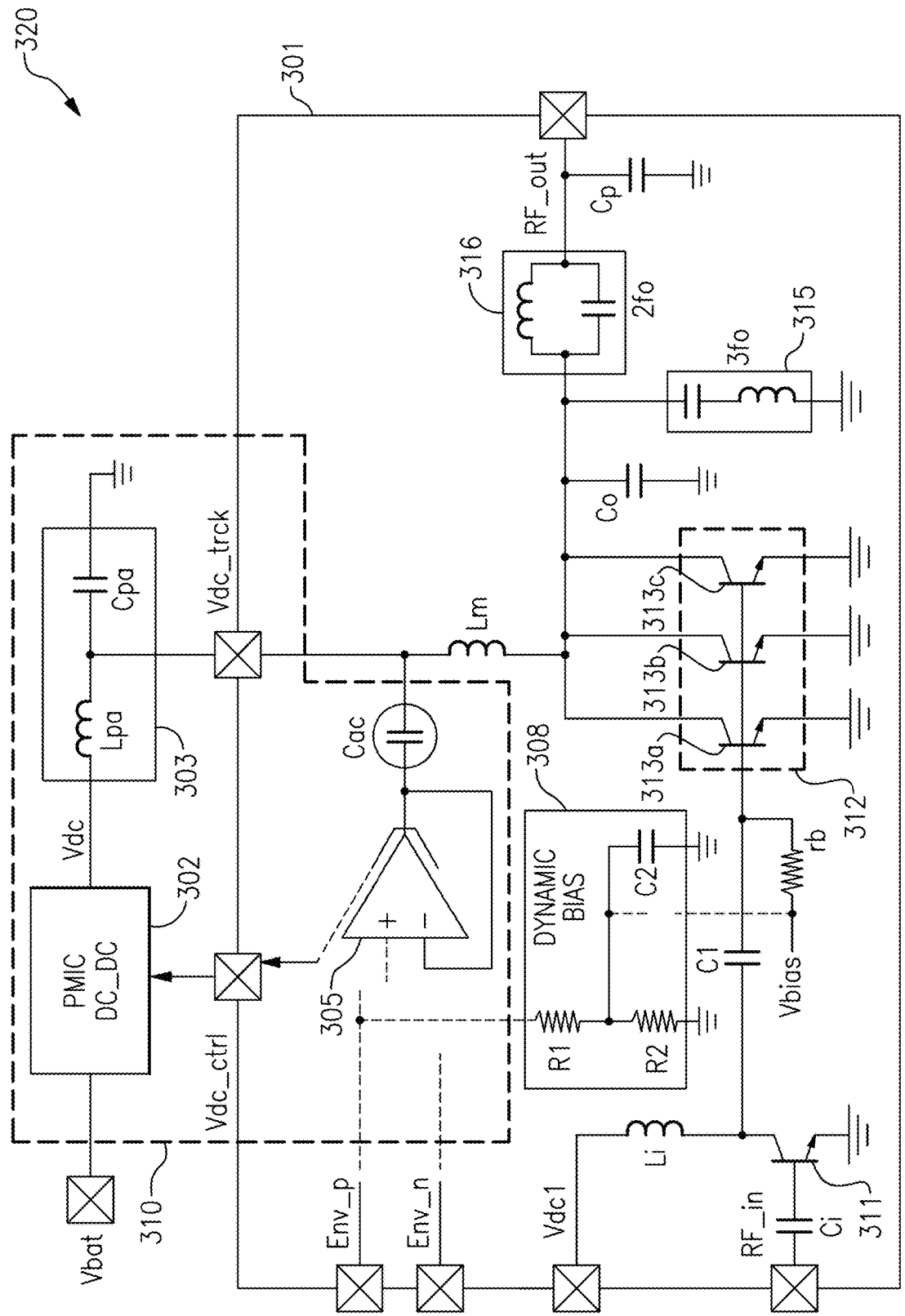
FIG. 8D is a schematic diagram of another embodiment of an envelope tracking system.

FIG. 8D is a schematic diagram of another embodiment of an envelope tracking system 320. The envelope tracking system 320 includes a power amplifier module 301, a power management integrated circuit (PMIC) 302, and an ET combiner 303.

As shown in FIG. 8D, the power amplifier module 301 includes a variety of pins, including a PMIC control pin (Vdc_ctrl), a tracking voltage pin (Vdc_trck), a non-inverted envelope signal pin (Env_p), an inverted envelope signal pin (Env_n), an input stage power supply pin (Vdc1), an RF signal input pin (RF_in), and an RF signal output pin (RF_out), in this example.

The power amplifier module 301 includes an error amplifier 305, a dynamic bias circuit 308, a bipolar input stage transistor 311, a bipolar output stage transistor 312 (implemented using transistor elements 313a, 313b, and 313c of a transistor array), a third order harmonic termination circuit 315, a second order harmonic termination circuit 316, an input stage capacitor Ci, an input stage inductor Li, an interstage capacitor C1, a bias resistor rb, an output state inductor Lm, an output stage capacitor Co, an output pin capacitor Cp, and an AC coupling capacitor Cac. Although one example of circuitry and pins is depicted, the power amplifier module 301 can be implemented in other ways.

In the illustrated embodiment, the envelope tracking system 320 includes an envelope tracker 310 implemented using a mix of components on the power amplifier module 301 and a mix of components off the power amplifier module 301.

The PMIC 302 provides DC-to-DC conversion to a battery voltage Vbat to generate a regulated voltage Vdc provided to the ET combiner 303. The regulation is controlled by a control signal from the PMIC control pin (Vdc_ctrl) of the power amplifier module 301. The ET combiner 303 includes an inductor Lpa connected between the regulated voltage Vdc and the tracking voltage pin (Vdc_trck), and a capacitor Cpa connected between ground and the tracking voltage pin (Vdc_trck).

With continuing reference to FIG. 8D, the error amplifier 305 includes an output that provides a current through the AC coupling capacitor Cac to adjust the voltage of the tracking voltage pin (Vdc_trck). The error amplifier 305 further provides the control signal to the PMIC control pin (Vdc_ctrl). In certain implementations, the control signal changes in relation to an output current of the error amplifier 305 (for instance, based on sensing or mirroring the output current). The error amplifier 305 includes feedback from the output to an inverted input. The non-inverted input of the error amplifier 305 is controlled by an envelope signal, for instance, by a single-ended envelope signal generated by buffering the differential envelope signal received between pins Env_p and Evn_n. However, other implementations are possible.

The input stage bipolar transistor 311 is powered by a first supply voltage from the input stage power supply pin (Vdc1), which is received through the input stage inductor Li. The output stage bipolar transistor 312 is powered by a second supply voltage generated by the envelope tracker 310. The second supply voltage is received through the output stage inductor Lm As shown in FIG. 8D, the base of the output stage bipolar transistor 312 is biased by a bias voltage Vbias received through the bias resistor rb. Furthermore, the baseline bias voltage set by the bias voltage Vbias is adjusted based on the envelope signal. For example, the dynamic bias circuit 308 includes a resistive voltage divider (R1 and R2) and a capacitor C2 for generating a dynamic bias signal that tracks the envelope signal. The dynamic bias signal is used to dynamically adjust the baseline set by the bias voltage Vbias, for instance, by using a bias amplifier sensing the dynamic bias voltage and injecting an adjustment signal into the base of the output stage bipolar transistor 312.

The input stage bipolar transistor 311 amplifies an RF input signal received from the RF signal input pin (RF_in) to generate an amplified RF signal, which is further amplified by the output stage bipolar transistor 312 to generate an RF output signal that is provided to the RF signal output pin (RF_out). Various examples of matching components and DC blocking capacitors are also depicted.

Figure 9A:
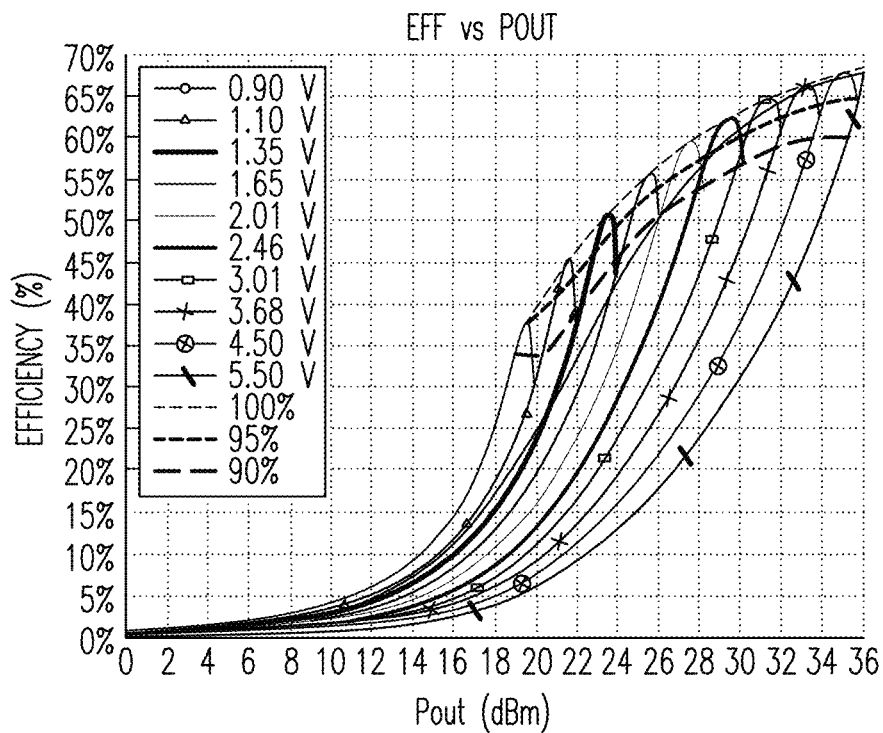
FIG. 9A is a graph of one example of efficiency versus output power for an envelope tracking system.

FIG. 9A is a graph of one example of efficiency versus output power for an envelope tracking system. The graph illustrates plots for an example envelope tracking system without power amplifier bias modulation.

Figure 9B:
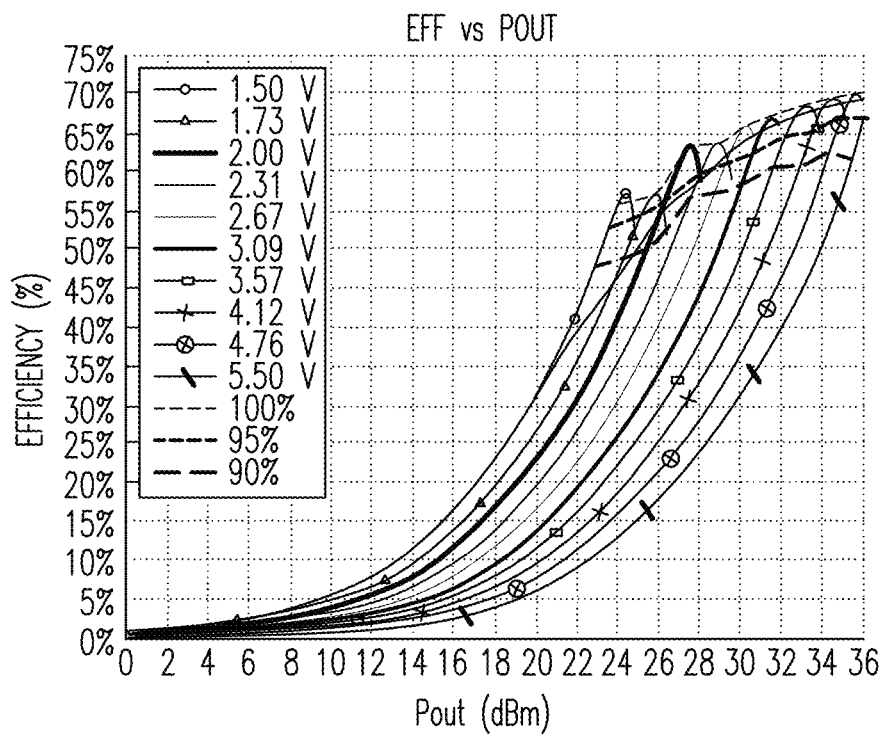
FIG. 9B is a graph of another example of efficiency versus output power for an envelope tracking system.

FIG. 9B is a graph of another example of efficiency versus output power for an envelope tracking system. The graph illustrates plots for an example envelope tracking system with power amplifier bias modulation.

As shown by a comparison of FIG. 9A and FIG. 9B, the envelope tracking system has higher efficiency when using power amplifier bias modulation. For instance, the example of FIG. 9B operates with 42% efficiency at 2 V/24 dBm, while the example of FIG. 9A operates with 35% efficiency at 2 V/24 dBm.

Although one example of simulation results are shown, simulation results can vary based on a number of factors, including, but not limited to, design implementation simulation models, simulation parameters, and/or simulation tools. Accordingly, other simulation results are possible.

Figure 10:
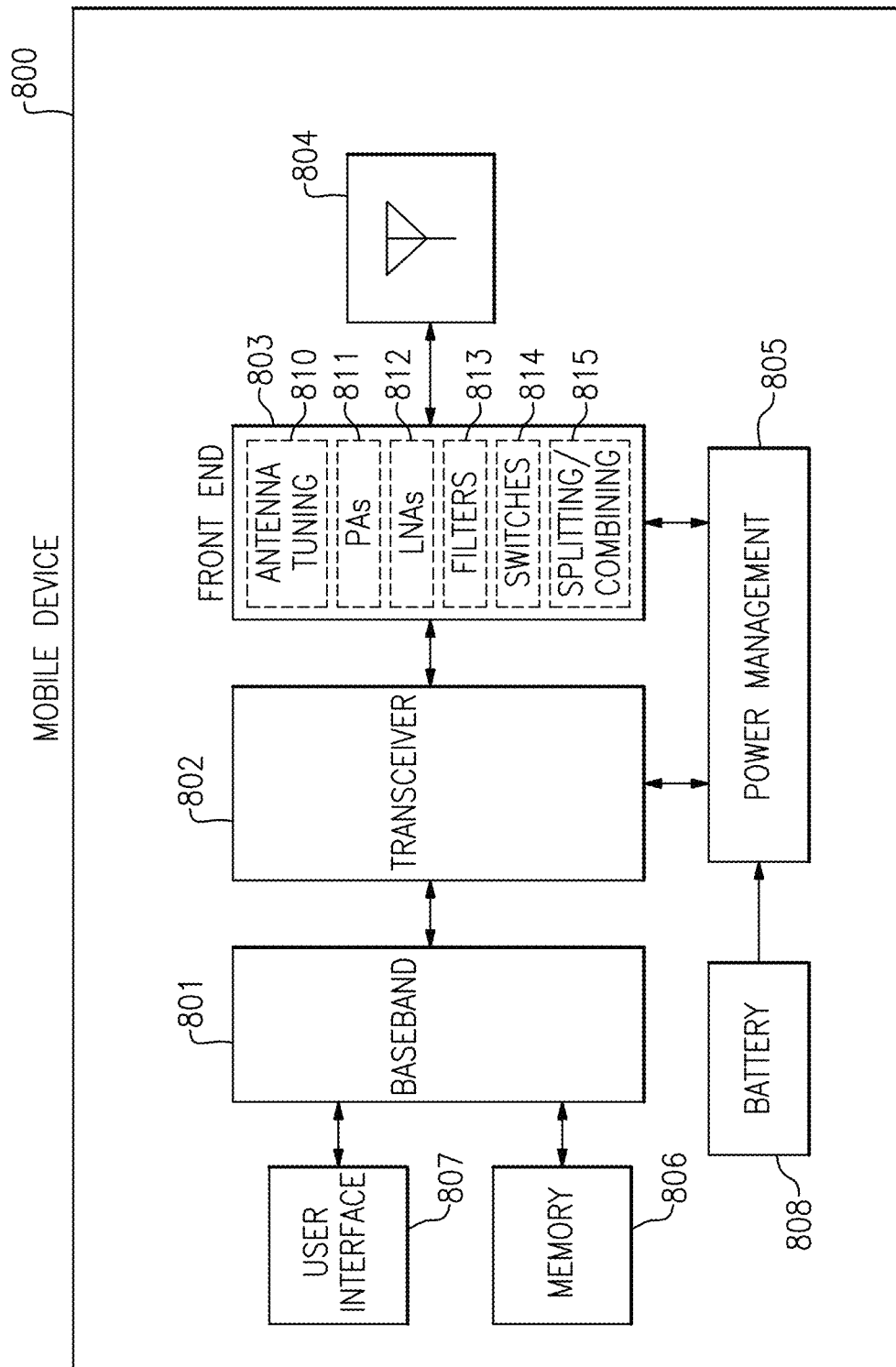
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (110), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
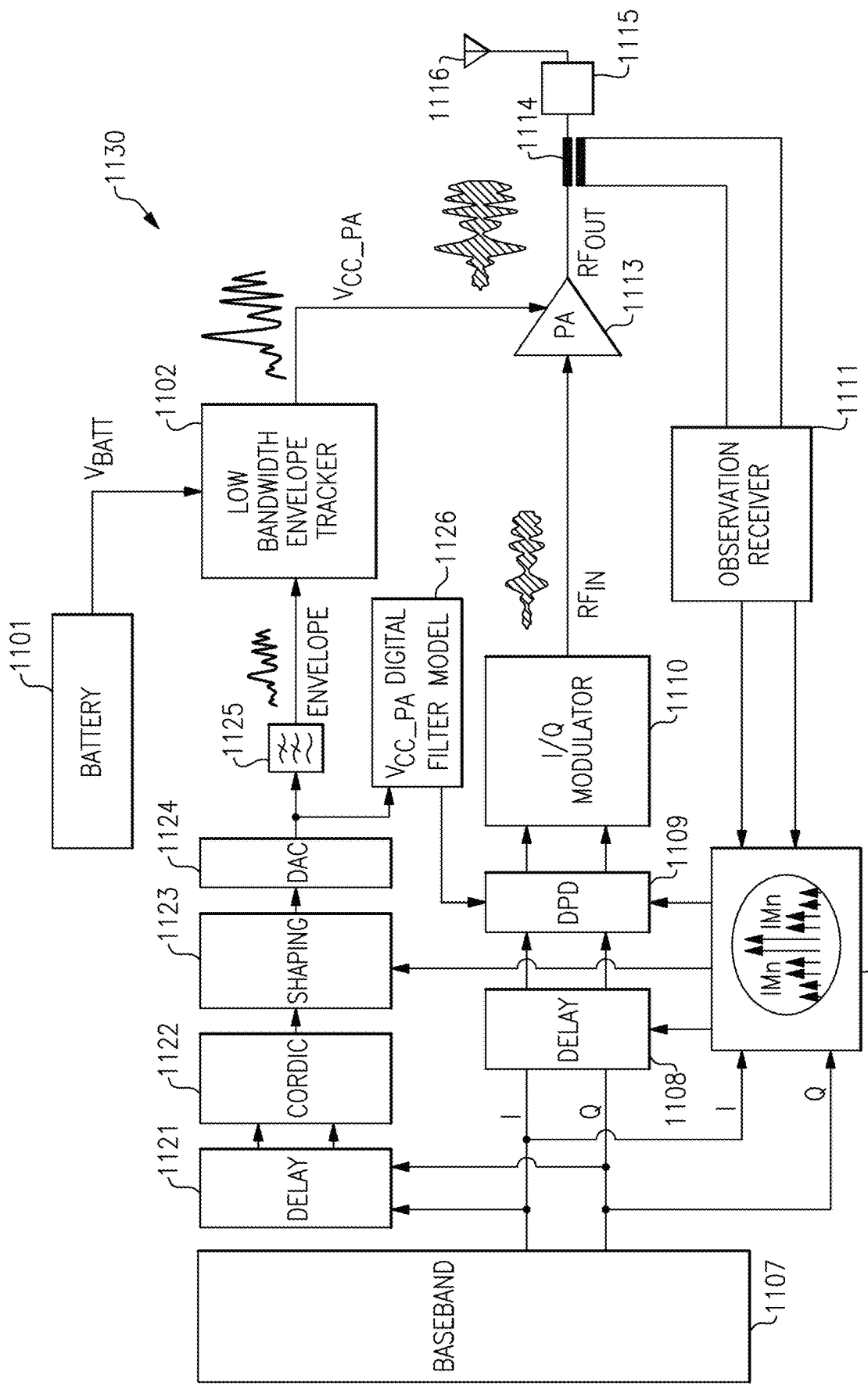
FIG. 11 is a schematic diagram of one embodiment of a communication system for transmitting RF signals.

FIG. 11 is a schematic diagram of one embodiment of a communication system 1130 for transmitting RF signals. The communication system 1130 includes a battery 1101, a low bandwidth envelope tracker 1102, a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, a reconstruction filter 1125, and a power amplifier supply voltage ($V_{CC\_PA}$) digital filter model 1126.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the low bandwidth envelope tracker 1102. In certain implementations, the reconstruction filter 1125 includes a low pass filter.

With continuing reference to FIG. 11, the low bandwidth envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal $RF_{IN}$. In certain implementations, the low bandwidth envelope tracker 1102 is implemented as an MLS envelope tracker. The power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $RF_{IN}$. In certain implementations, the intermodulation detection circuit 1112 also serves to control shaping provided by the shaping circuit 1123.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

In the illustrated embodiment, the DPD is also based on a supply voltage modeling signal from the $V_{CC\_PA}$ digital filter model 1126. The supply voltage modeling signal estimates the voltage level of the power amplifier supply voltage $V_{CC\_PA}$ at the power amplifier 1113 such that DPD can be based on both the level of the RF signal and the level of the power amplifier supply voltage $V_{CC\_PA}$.

For instance, such modeling can account for an effect of filtering of the power amplifier 1113 on the power amplifier supply voltage $V_{CC\_PA}$. By including the $V_{CC\_PA}$ digital filter model 1126, the RF signal (which can be fast and/or of higher bandwidth than the modulation bandwidth of the low bandwidth envelope tracker 1102) can be compensated for imperfections in the power amplifier supply voltage $V_{CC\_PA}$ arising from low modulation bandwidth.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 12:
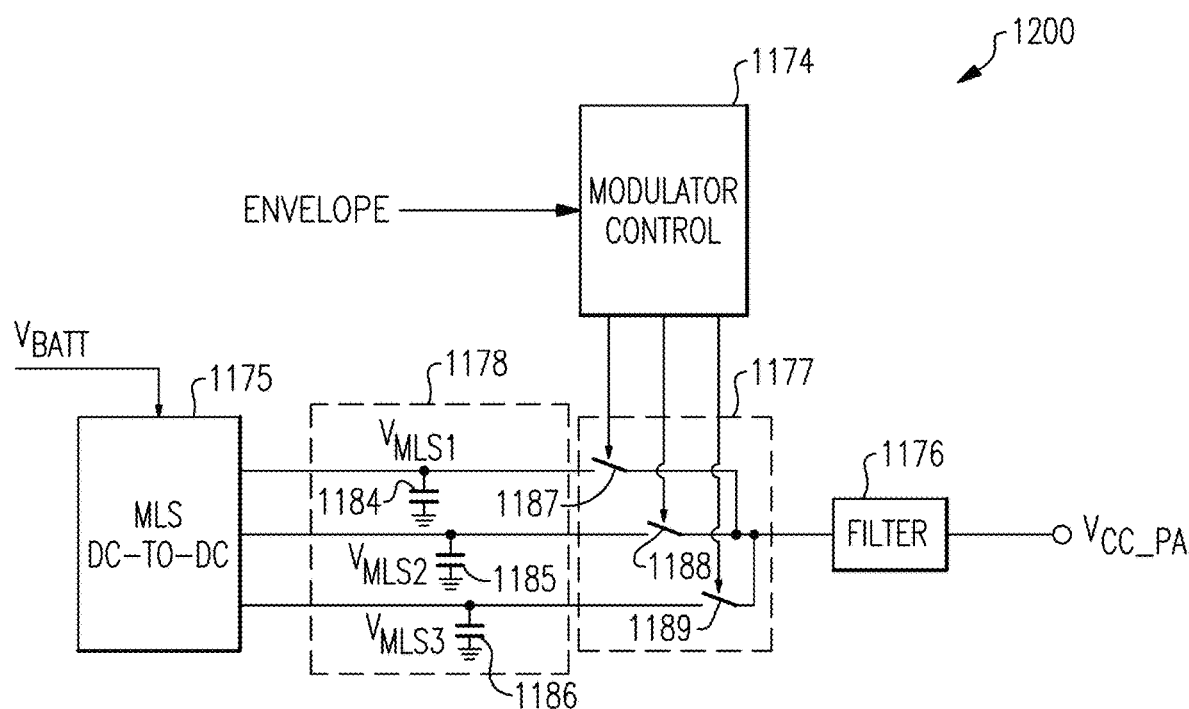
FIG. 12 is a schematic diagram of a multi-level supply (MLS) envelope tracker according to another embodiment.

FIG. 12 is a schematic diagram of an MLS envelope tracker 1200 according to another embodiment. The MLS envelope tracker 1200 includes a modulator control circuit 1174, an MLS DC-to-DC converter 1175, a modulator output filter 1176, a modulator switch bank 1177, and a decoupling capacitor bank 1178.

Although one embodiment of an MLS envelope tracker is shown, the teachings herein are applicable to envelope trackers implemented in a wide variety of ways.

As shown in FIG. 12, the decoupling capacitor bank 1178 includes a first capacitor 1184, a second capacitor 1185, and a third capacitor 1186. Additionally, the modulator switch bank 1177 includes a first switch 1187, a second switch 1188, and a third switch 1189. Although three decoupling capacitors and three switches are shown, more or fewer decoupling capacitors and/or more or fewer switches can be included.

In the illustrated embodiment, the MLS DC-to-DC converter 1175 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. While illustrated as outputting three regulated voltages, the MLS DC-to-DC converter 1175 can generate more or fewer regulated voltages. In certain implementations, one or more of the regulated voltages are boosted voltages having a voltage level greater than the voltage level of the battery voltage $V_{BATT}$.

The decoupling capacitor bank 1178 stabilizes the regulated voltages generated by the MLS DC-to-DC converter 1175. For example, the first decoupling capacitor 1184 provides decoupling to the first regulated voltage $V_{MLS1}$, the second decoupling capacitor 1185 provides decoupling for second regulated voltage $V_{MLS2}$, and the third decoupling capacitor 1186 provides decoupling for the third regulated voltage $V_{MLS3}$.

The modulator control circuit 1174 processes an envelope signal ENVELOPE to select particular switches of the modulator switch bank 1177. In certain implementations, the modulator control circuit 1174 provides at least one of coding or dithering when controlling the modulator switch bank 1177 to compensate for artifacts arising from opening and closing the switches.

The filter 1176 filters the output of the modulator switch bank 1177 to generate the power amplifier supply voltage $V_{CC\_PA}$.

Figure 13A:
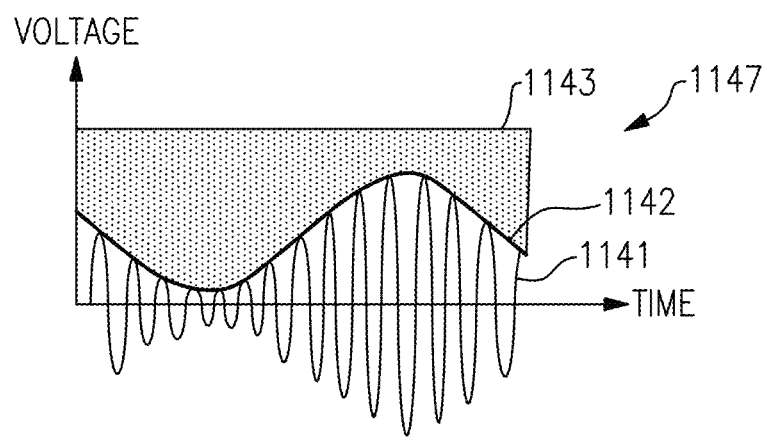
FIG. 13A shows a first example of a power amplifier supply voltage versus time.
Figure 13B:
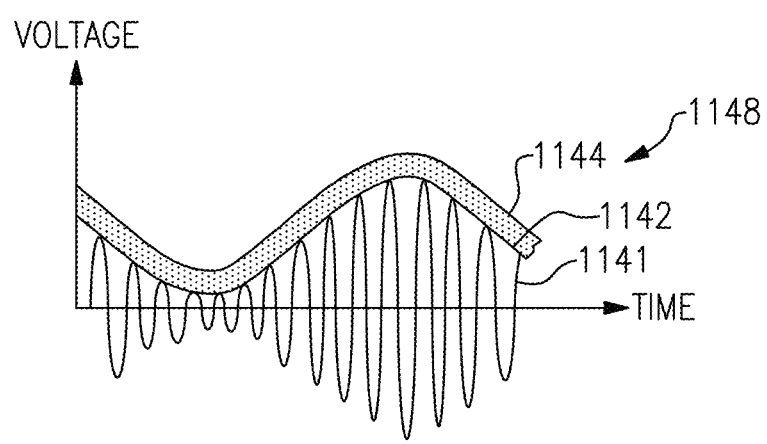
FIG. 13B shows a second example of a power amplifier supply voltage versus time.

FIGS. 13A and 13B show two examples of power amplifier supply voltage versus time.

In FIG. 13A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142. However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 13B, a graph 1148 illustrates another example of the voltage of an RF signal 1141 and a power amplifier supply voltage 1144 versus time. In contrast to the power amplifier supply voltage 1143 of FIG. 13A, the power amplifier supply voltage 1144 of FIG. 13B changes in relation to the envelope 1142 of the RF signal 1141. The area between the power amplifier supply voltage 1144 and the envelope 1142 in FIG. 13B is less than the area between the power amplifier supply voltage 1143 and the envelope 1142 in FIG. 13A, and thus the graph 1148 of FIG. 13B can be associated with an envelope tracking system having greater energy efficiency.

Figure 14:
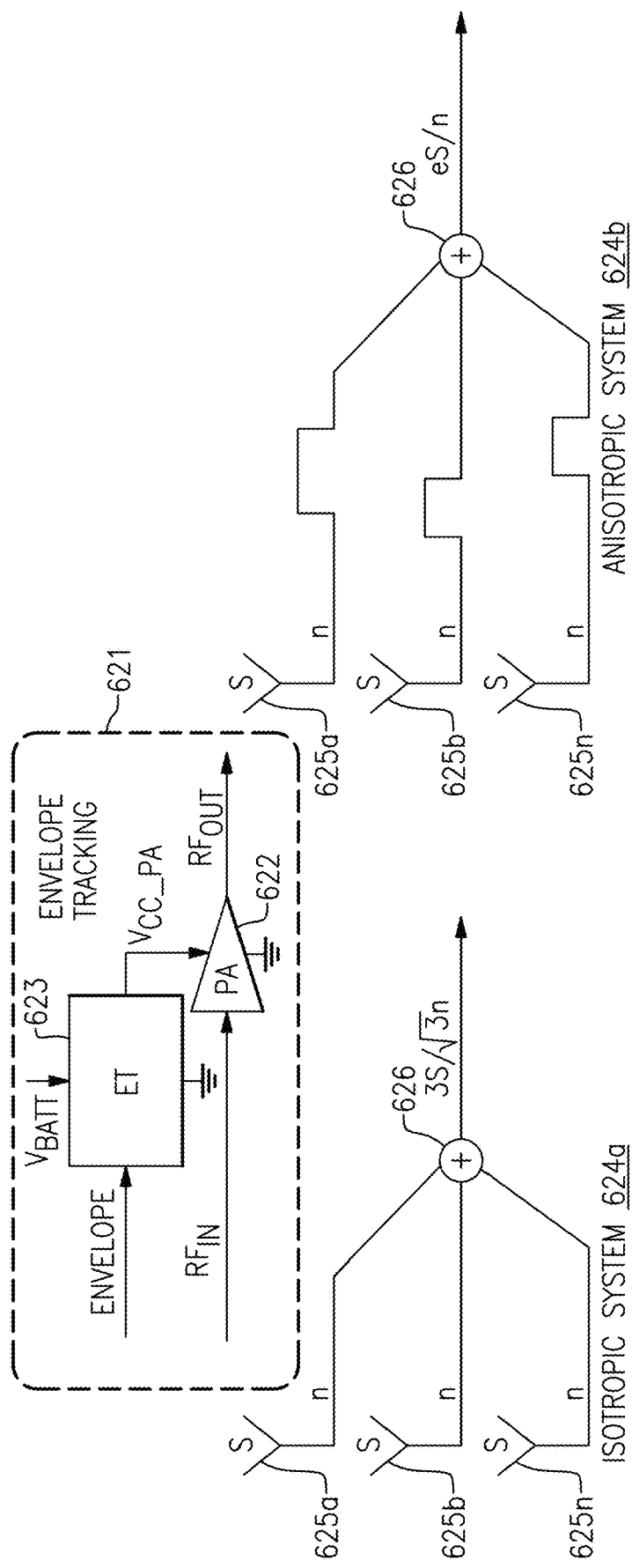
FIG. 14 is an annotated diagram of an envelope tracking system in relation to Shannon's theorem.

FIG. 14 is an annotated diagram of an envelope tracking system 621 in relation to Shannon's theorem. The envelope tracking system 621 includes a power amplifier 622 that amplifies an RF input signal $RF_{IN}$ to generates an RF output signal $RF_{OUT}$, and an envelope tracker 623 powered by a battery voltage $V_{BATT}$ and that controls a supply voltage $V_{CC\_PA}$ of the power amplifier 622 in relation to an envelope of the RF input signal $RF_{IN}$.

As shown in FIG. 14, annotations related to Shannon's theorem have been provided. In particular, an isotropic system 624a with antennas 625a, 625b, . . . 625n and a combiner 626 is shown. Each of the antennas 625a, 625b, . . . 625n receives signal S, and the combiner 626 output 3S(On). Additionally, an anisotropic system 624b with antennas 625a, 625b, . . . 625n and a combiner 626 is also shown. Each of the antennas 625a, 625b, . . . 625n receives signal S, and the combiner 626 of the anisotropic system 624b outputs eS/n.

ET techniques can be seen as an extension of the Shannon theory for anisotropic systems, where factor e represents the increase of the output signal when the envelope signal is aligned with the RF signal going into the power amplifier.

The capacity of a wireless system as determined by Shannon formula is given in Equation 1 below.

$$C = B_w \sum_{k=1}^{k} \log_2\left(1 + \frac{en * S_k}{N_x + I_k}\right) \qquad \text{Equation 1}$$

To achieve higher capacity following Equation 1, the channel bandwidth can be increased, the spatial multiplexing level k can be raised through MIMO, the noise $N_x$ can be decreased through improved receive sensitivity, and/or in-band interference on link k can be reduced (for instance, in multiple uplink transmit such as carrier aggregation and MIMO). Moreover, the channel capacity C can be increased through use of envelope tracking.

CONCLUSION

Some of the embodiments described above have provided examples in connection with mobile devices. However, the principles and advantages of the embodiments can be used for any other systems or apparatus that have needs for envelope tracking.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a radio frequency signal;
   a front end circuit including a power amplifier configured to receive the radio frequency signal at a signal input and to provide an amplified radio frequency signal at a signal output, the power amplifier including an amplifier transistor configured to receive the radio frequency signal at a base, and a cascode transistor having an emitter connected to a collector of the amplifier transistor and a collector connected to the signal output; and
   a power management circuit including a multi-level supply envelope tracker configured to generate a power amplifier supply voltage of the power amplifier based on an envelope signal indicating an envelope of the radio frequency signal, a programmable supply voltage filter operable to filter the power amplifier supply voltage to generate a filtered power amplifier supply voltage, and a bias modulation circuit configured to modulate a bias of a base of the cascode transistor of the power amplifier based on a voltage level of the filtered power amplifier supply voltage.

2. The mobile device of claim 1 wherein the multi-level supply envelope tracker has a modulation bandwidth less than a full bandwidth of the radio frequency signal.

3. The mobile device of claim 1 wherein the multi-level supply envelope tracker includes a multi-level supply DC-to-DC converter configured to generate a plurality of regulated voltages of different voltage levels, a modulator configured to receive the plurality of regulated voltages and having an output configured to control the power amplifier supply voltage, and a control circuit configured to control the modulator based on the envelope signal.

4. The mobile device of claim 3 wherein the multi-level supply envelope tracker further includes a passive filter interposed between the output of the modulator and a supply input to the power amplifier.

5. The mobile device of claim 4 wherein the bias modulation circuit receives the power amplifier supply voltage from the output of the modulator prior to filtering by the passive filter, and the power amplifier receives the power amplifier supply voltage after filtering by the passive filter.

6. The mobile device of claim 5 wherein the power management circuit further includes a separate supply voltage filter operable to filter the power amplifier supply voltage to generate a filtered power amplifier supply voltage that serves as an input to the bias modulation circuit.

7. The mobile device of claim 6 wherein the separate supply voltage filter is programmable.

8. The mobile device of claim 3 wherein the modulator further includes a plurality of switches each electrically connected between a corresponding one of the plurality of regulated voltages and the output.

9. The mobile device of claim 1 wherein the programmable supply voltage filter is implemented as a low pass filter having a controllable corner frequency.

10. An envelope tracking system comprising:
    a power amplifier configured to receive a radio frequency signal at a signal input and to provide an amplified radio frequency signal at a signal output, the power amplifier including an amplifier transistor configured to receive the radio frequency signal at a base, and a cascode transistor having an emitter connected to a collector of the amplifier transistor and a collector connected to the signal output;
    a multi-level supply envelope tracker configured to generate a power amplifier supply voltage of the power amplifier based on an envelope signal indicating an envelope of the radio frequency signal;
    a programmable supply voltage filter operable to filter the power amplifier supply voltage to generate a filtered power amplifier supply voltage; and a bias modulation circuit configured to modulate a bias of a base of the cascode transistor of the power amplifier based on a voltage level of the filtered power amplifier supply voltage.

11. The envelope tracking system of claim 10 wherein the multi-level supply envelope tracker has a modulation bandwidth less than a full bandwidth of the radio frequency signal.

12. The envelope tracking system of claim 10 wherein the multi-level supply envelope tracker includes a multi-level supply DC-to-DC converter configured to generate a plurality of regulated voltages of different voltage levels, a modulator configured to receive the plurality of regulated voltages and having an output configured to control the power amplifier supply voltage, and a control circuit configured to control the modulator based on the envelope signal.

13. The envelope tracking system of claim 12 wherein the multi-level supply envelope tracker further includes a passive filter interposed between the output of the modulator and a supply input to the power amplifier.

14. The envelope tracking system of claim 13 wherein the bias modulation circuit receives the power amplifier supply voltage from the output of the modulator prior to filtering by the passive filter, and the power amplifier receives the power amplifier supply voltage after filtering by the passive filter.

15. The envelope tracking system of claim 14 further comprising a separate supply voltage filter operable to filter the power amplifier supply voltage to generate a filtered power amplifier supply voltage that serves as an input to the bias modulation circuit.

16. The envelope tracking system of claim 15 wherein the separate supply voltage filter is programmable.

17. A method of envelope tracking, the method comprising:
receiving a radio frequency signal at a signal input of a power amplifier and providing an amplified radio frequency signal at a signal output of the power amplifier, the power amplifier including an amplifier transistor having a base receiving the radio frequency signal and a cascode transistor having an emitter connected to a collector of the amplifier transistor and a collector connected to the signal output;
generating a power amplifier supply voltage of the power amplifier based on an envelope signal using a multi-level supply envelope tracker, the envelope signal indicating an envelope of the radio frequency signal;
filtering the power amplifier supply voltage to generate a filtered power amplifier supply voltage using a programmable supply voltage filter; and
modulating a bias of a base of the cascode transistor of the power amplifier based on a voltage level of the filtered power amplifier supply voltage using a bias modulation circuit.

18. The method of claim 17 wherein generating the power amplifier supply voltage includes generating a plurality of regulated voltages of different voltage levels using a multi-level supply DC-to-DC converter, and modulating the plurality of regulated voltages based on the envelope signal to generate the power amplifier supply voltage using a modulator.

19. The method of claim 18 further comprising filtering the power amplifier supply voltage using a passive filter interposed between an output of the modulator and a supply input to the power amplifier.

20. The method of claim 18 further comprising setting a corner frequency of the programmable supply voltage filter.

* * * * *